United States Patent
Tanaka et al.

(10) Patent No.: US 11,183,499 B2
(45) Date of Patent: Nov. 23, 2021

(54) DYNAMIC RANDOM ACCESS MEMORY AND METHODS OF MANUFACTURING, WRITING AND READING THE SAME

(71) Applicant: Winbond Electronics Corp., Taichung (TW)

(72) Inventors: Yoshinori Tanaka, Kanagawa (JP); Wei-Che Chang, Taichung (TW); Kai Jen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 90 days.

(21) Appl. No.: 16/197,380

(22) Filed: Nov. 21, 2018

(65) Prior Publication Data
US 2019/0393226 A1 Dec. 26, 2019

(30) Foreign Application Priority Data
Jun. 26, 2018 (TW) ................. 107121850

(51) Int. Cl.
*H01L 27/108* (2006.01)
*G11C 11/408* (2006.01)
(Continued)

(52) U.S. Cl.
CPC ........ *H01L 27/10885* (2013.01); *G11C 5/063* (2013.01); *G11C 11/4085* (2013.01);
(Continued)

(58) Field of Classification Search
CPC ........... H01L 27/10885; H01L 23/5222; H01L 29/1083; H01L 27/10844–10888;
(Continued)

(56) References Cited

U.S. PATENT DOCUMENTS 4,987,470 A * 1/1991 Suzuki .............. H01L 27/10861
257/506
5,929,477 A * 7/1999 McAllister Burns, Jr. ..................
H01L 27/10864
257/306

(Continued)

FOREIGN PATENT DOCUMENTS

| CN | 1897281 | 1/2007 |
| JP | H0422169 | 1/1992 |
| TW | I254417 | 5/2006 |

OTHER PUBLICATIONS

"Office Action of Taiwan Counterpart Application," dated Jul. 22, 2019, p. 1-p. 7.

(Continued)

*Primary Examiner* — Sophia T Nguyen
(74) *Attorney, Agent, or Firm* — JCIPRNET

(57) ABSTRACT

A dynamic random access memory (DRAM) and methods of manufacturing, writing and reading the same. The DRAM includes a substrate, a bit line, a sidewall structure and an interconnection structure. The bit line is disposed on the substrate. The sidewall structure is disposed on a sidewall of the bit line. The sidewall structure includes a first insulation layer, a second insulation layer, and a shield conductor layer. The first insulation layer is disposed on the sidewall of the bit line. The second insulation layer is disposed on the first insulation layer. The shield conductor layer is disposed between the first insulation layer and the second insulation layer. The interconnection structure is electrically connected to the shield conductor layer. The DRAM and the manufacturing, writing and reading methods thereof can effectively reduce the parasitic capacitance of the bit line.

8 Claims, 32 Drawing Sheets

(51) Int. Cl.
 *G11C 11/4094* (2006.01)
 *G11C 11/4097* (2006.01)
 *G11C 5/06* (2006.01)

(52) U.S. Cl.
 CPC ...... *G11C 11/4094* (2013.01); *G11C 11/4097* (2013.01); *H01L 27/1085* (2013.01); *H01L 27/10823* (2013.01); *H01L 27/10888* (2013.01); *H01L 27/10891* (2013.01)

(58) Field of Classification Search
 CPC ....... H01L 27/10808–10814; H01L 27/10841; H01L 27/10882; G11C 11/4094; G11C 11/4097
 See application file for complete search history.

(56) References Cited

U.S. PATENT DOCUMENTS

| | | | | |
|---|---|---|---|---|
| 5,998,261 A * | 12/1999 | Hofmann | .......... | H01L 27/11517 438/257 |
| 6,391,736 B1 * | 5/2002 | Uh | .......... | H01L 27/10855 257/E21.011 |
| 9,356,073 B1 * | 5/2016 | Kim | .......... | H01L 21/76805 |
| 9,881,865 B1 * | 1/2018 | Kim | .......... | H01L 23/53257 |
| 9,947,669 B1 * | 4/2018 | Takesako | .......... | H01L 27/10814 |
| 10,074,656 B1 * | 9/2018 | Wang | .......... | H01L 27/10814 |
| 2003/0162396 A1 * | 8/2003 | Kohyama | .......... | H01L 21/76897 438/689 |
| 2003/0169629 A1 * | 9/2003 | Goebel | .......... | H01L 27/10864 365/200 |
| 2004/0150025 A1 * | 8/2004 | Ogawa | .......... | H01L 27/10882 257/301 |
| 2004/0180531 A1 * | 9/2004 | Horikoshi | .......... | G11C 11/16 438/622 |
| 2004/0195607 A1 * | 10/2004 | Maldei | .......... | H01L 27/10888 257/296 |
| 2005/0072999 A1 * | 4/2005 | Matamis | .......... | H01L 27/115 257/314 |
| 2006/0198199 A1 * | 9/2006 | Pittikoun | .......... | H01L 27/115 365/185.28 |
| 2006/0267158 A1 * | 11/2006 | Weis | .......... | G11C 7/18 257/659 |
| 2007/0181932 A1 * | 8/2007 | Happ | .......... | H01L 45/1226 257/314 |
| 2007/0207556 A1 * | 9/2007 | Liao | .......... | H01L 29/66833 438/2 |
| 2007/0269948 A1 * | 11/2007 | Manger | .......... | H01L 27/115 438/257 |
| 2007/0278529 A1 * | 12/2007 | Lai | .......... | H01L 27/2436 257/209 |
| 2009/0004843 A1 * | 1/2009 | Mokhlesi | .......... | H01L 27/115 438/622 |
| 2009/0026515 A1 * | 1/2009 | Shin | .......... | H01L 28/91 257/296 |
| 2010/0127398 A1 * | 5/2010 | Kim | .......... | H01L 21/76831 257/773 |
| 2010/0327407 A1 * | 12/2010 | Kang | .......... | H01L 27/10894 257/532 |
| 2011/0303974 A1 * | 12/2011 | Kim | .......... | H01L 27/10894 257/329 |
| 2012/0086063 A1 * | 4/2012 | Taniguchi | .......... | H01L 27/10888 257/300 |
| 2012/0156868 A1 * | 6/2012 | Kim | .......... | H01L 27/10876 438/589 |
| 2012/0168899 A1 * | 7/2012 | Kim | .......... | H01L 21/76897 257/522 |
| 2013/0320550 A1 * | 12/2013 | Kim | .......... | H01L 21/76897 257/773 |
| 2014/0027924 A1 * | 1/2014 | Lee | .......... | H01L 21/02107 257/774 |
| 2014/0077333 A1 * | 3/2014 | Son | .......... | H01L 21/764 257/522 |
| 2014/0087535 A1 * | 3/2014 | Roh | .......... | H01L 21/823418 438/285 |
| 2014/0179102 A1 * | 6/2014 | Ng | .......... | H01L 21/76897 438/666 |
| 2014/0231892 A1 * | 8/2014 | Song | .......... | H01L 21/76897 257/296 |
| 2014/0291804 A1 * | 10/2014 | Kim | .......... | G11C 11/4097 257/532 |
| 2014/0299989 A1 * | 10/2014 | Lim | .......... | H01L 23/48 257/751 |
| 2014/0353744 A1 * | 12/2014 | Jung | .......... | H01L 27/10885 257/330 |
| 2014/0357076 A1 * | 12/2014 | Ng | .......... | H01L 21/76834 438/652 |
| 2015/0035050 A1 * | 2/2015 | Yeom | .......... | H01L 21/76897 257/330 |
| 2015/0061134 A1 * | 3/2015 | Lee | .......... | H01L 21/76895 257/751 |
| 2015/0061154 A1 * | 3/2015 | Choi | .......... | H01L 23/528 257/774 |
| 2015/0099344 A1 * | 4/2015 | Kim | .......... | H01L 27/10891 438/424 |
| 2015/0126013 A1 * | 5/2015 | Hwang | .......... | H01L 23/5226 438/381 |
| 2015/0132942 A1 * | 5/2015 | Kim | .......... | H01L 21/76224 438/618 |
| 2015/0235950 A1 * | 8/2015 | Han | .......... | H01L 27/10888 257/773 |
| 2015/0255466 A1 * | 9/2015 | Hwang | .......... | H01L 21/76877 438/586 |
| 2015/0325703 A1 * | 11/2015 | Zhu | .......... | H01L 29/40114 257/316 |
| 2015/0333069 A1 * | 11/2015 | Kim | .......... | H01L 29/66621 257/334 |
| 2015/0340281 A1 * | 11/2015 | Lee | .......... | H01L 21/764 438/5 |
| 2015/0364334 A1 * | 12/2015 | Kang | .......... | H01L 21/32139 438/703 |
| 2016/0027727 A1 * | 1/2016 | Kim | .......... | H01L 27/10876 257/774 |
| 2016/0181143 A1 * | 6/2016 | Kwon | .......... | H01L 29/4991 438/586 |
| 2016/0307900 A1 * | 10/2016 | Kim | .......... | H01L 29/4236 |
| 2016/0322365 A1 * | 11/2016 | Kim | .......... | H01L 29/4236 |
| 2016/0351501 A1 * | 12/2016 | Chun | .......... | H01L 21/7682 |
| 2016/0358850 A1 * | 12/2016 | Park | .......... | H01L 23/528 |
| 2017/0005099 A1 * | 1/2017 | Lee | .......... | H01L 21/823481 |
| 2017/0084710 A1 * | 3/2017 | Koh | .......... | H01L 27/10823 |
| 2017/0125283 A1 * | 5/2017 | Lee | .......... | H01L 27/10814 |
| 2017/0162603 A1 | 6/2017 | Yamazaki et al. | | |
| 2017/0186759 A1 * | 6/2017 | Piazza | .......... | H01L 21/28035 |
| 2017/0229174 A1 * | 8/2017 | Or-Bach | .......... | G11C 13/0069 |
| 2017/0271340 A1 * | 9/2017 | Kim | .......... | H01L 27/10823 |
| 2017/0288037 A1 * | 10/2017 | Zhong | .......... | H01L 29/4983 |
| 2018/0158718 A1 * | 6/2018 | Lee | .......... | H01L 27/10894 |
| 2018/0166450 A1 * | 6/2018 | Kim | .......... | H01L 27/10823 |
| 2018/0226410 A1 * | 8/2018 | Chang | .......... | H01L 27/10897 |
| 2018/0254244 A1 * | 9/2018 | Huang | .......... | H01L 23/5226 |
| 2018/0269211 A1 * | 9/2018 | Kim | .......... | H01L 21/02178 |
| 2018/0286871 A1 * | 10/2018 | Chang | .......... | H01L 27/10876 |
| 2018/0342521 A1 * | 11/2018 | Son | .......... | H01L 27/10885 |
| 2019/0043959 A1 * | 2/2019 | Lee | .......... | H01L 21/823475 |
| 2019/0088739 A1 * | 3/2019 | Lee | .......... | H01L 27/10897 |
| 2019/0096890 A1 * | 3/2019 | Lee | .......... | H01L 23/5226 |
| 2019/0103302 A1 * | 4/2019 | Yoon | .......... | H01L 27/10855 |
| 2019/0164975 A1 * | 5/2019 | Song | .......... | H01L 23/5329 |
| 2019/0189620 A1 * | 6/2019 | Wang | .......... | H01L 27/10876 |
| 2019/0206872 A1 * | 7/2019 | Kim | .......... | H01L 27/10885 |
| 2019/0207083 A1 * | 7/2019 | Zhong | .......... | H01L 27/222 |
| 2019/0287981 A1 * | 9/2019 | Wu | .......... | H01L 29/42344 |
| 2019/0296024 A1 * | 9/2019 | Ji | .......... | H01L 27/10855 |
| 2019/0296026 A1 * | 9/2019 | Ji | .......... | H01L 21/31144 |
| 2019/0393226 A1 * | 12/2019 | Tanaka | .......... | H01L 27/10888 |
| 2020/0020697 A1 * | 1/2020 | Kim | .......... | H01L 27/10888 |
| 2020/0043941 A1 * | 2/2020 | Kim | .......... | H01L 27/1085 |

(56) References Cited

U.S. PATENT DOCUMENTS

2020/0066728 A1* 2/2020 Lu .................... H01L 27/10888
2020/0203348 A1* 6/2020 Kim ...................... H01L 23/528
2020/0395363 A1* 12/2020 Kim .................. H01L 27/10855

OTHER PUBLICATIONS

Office Action of China Counterpart Application, dated Jul. 9, 2021, pp. 1-11.
Little Bean Van Der Sar, "The most easy-to-understand graphic explanation of DRAM basic unit", Nov. 17, 2014, with English translation thereof, Available at: https://blog.csdn.net/chenming092100/article/details/78562730.

* cited by examiner

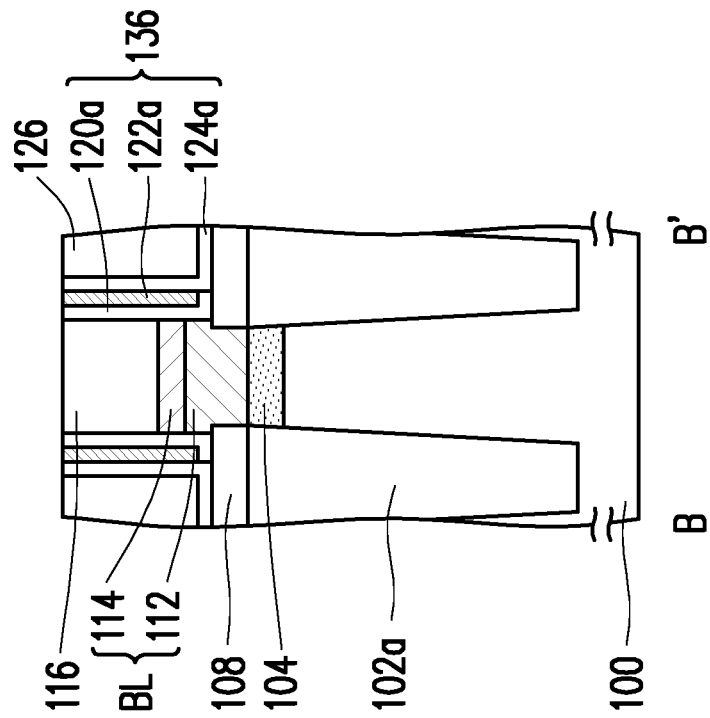
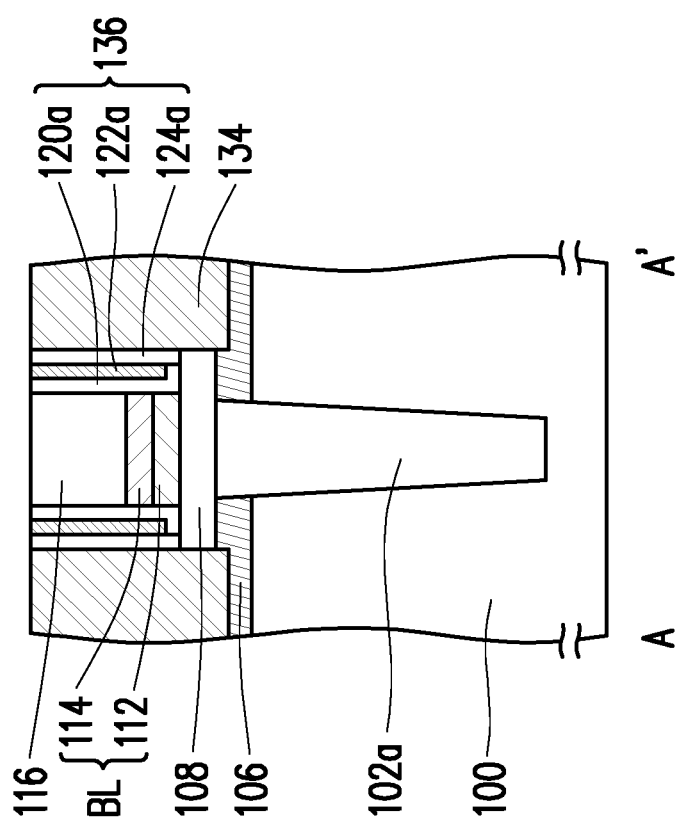
FIG. 2F
FIG. 3F

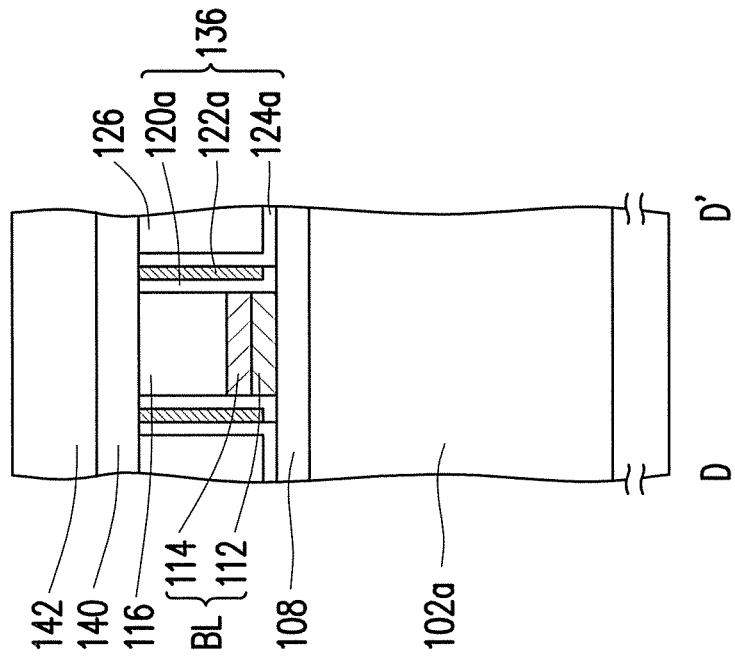
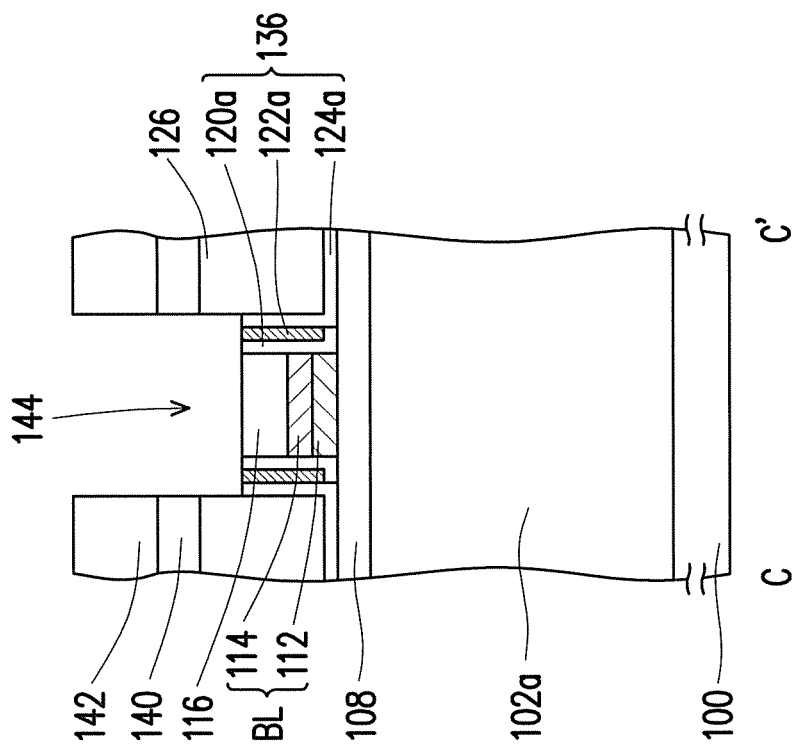

Before performing reading, an equalizing voltage ($V_{BLEQ}$) is applied to a bit line BL, and a shield voltage ($V_S$) is applied to a shield conductor layer 122a, wherein the equalizing voltage ($V_{BLEQ}$) and the shield voltage ($V_S$) are respectively smaller than a bit line high level voltage ($V_{BLH}$) and larger than a bit line low level voltage ($V_{BLL}$) — S300

A word line operating voltage ($V_{WL}$) is applied to a word line WL to perform reading a dynamic random access memory 10 — S302

FIG. 8

DYNAMIC RANDOM ACCESS MEMORY AND METHODS OF MANUFACTURING, WRITING AND READING THE SAME

CROSS-REFERENCE TO RELATED APPLICATION

This application claims the priority benefit of Taiwan application serial no. 107121850, filed on Jun. 26, 2018. The entirety of the above-mentioned patent application is hereby incorporated by reference herein and made a part of this specification.

BACKGROUND OF THE INVENTION

Field of the Invention

The invention relates to a memory and methods of manufacturing, writing and reading the same, and particularly relates to a dynamic random access memory (DRAM) and methods of manufacturing, writing and reading the same.

Description of Related Art

As the size of dynamic random access memory design continues to shrink, semiconductor devices continue to develop toward high integration. The performance of the dynamic random access memory may be affected by the parasitic capacitance of a bit line. Therefore, how to effectively reduce the parasitic capacitance of the bit line has become an important research topic in this field.

SUMMARY OF THE INVENTION

The invention provides a dynamic random access memory and manufacturing, writing and reading methods thereof which can effectively reduce the parasitic capacitance of the bit line.

The invention provides a dynamic random access memory including a substrate, a bit line, a sidewall structure and an interconnection structure. The bit line is disposed on the substrate. The sidewall structure is disposed on a sidewall of the bit line. The sidewall structure includes a first insulation layer, a second insulation layer, and a shield conductor layer. The first insulation layer is disposed on the sidewall of the bit line. The second insulation layer is disposed on the first insulation layer. The shield conductor layer is disposed between the first insulation layer and the second insulation layer. The interconnection structure is electrically connected to the shield conductor layer.

The invention provides a method of manufacturing a dynamic random access memory including the following steps. A bit line is formed on a substrate. A sidewall structure is formed on a sidewall of the bit line. The sidewall structure includes a first insulation layer, a second insulation layer, and a shield conductor layer. The first insulation layer is disposed on the sidewall of the bit line. The second insulation layer is disposed on the first insulation layer. The shield conductor layer is disposed between the first insulation layer and the second insulation layer. An interconnection structure electrically connected to the shield conductor layer is formed.

The invention provides a method of writing a dynamic random access memory. A writing method of a first logic level includes the following steps. A first shield voltage is applied to the shield conductor layer. A bit line high level voltage is applied to the bit line. The first shield voltage is larger than or equal to the bit line high level voltage. A first word line operating voltage is applied to the word line. A writing method of a second logic level includes the following steps. A second shield voltage is applied to the shield conductor layer. A bit line low level voltage is applied to the bit line. The second shield voltage is smaller than or equal to the bit line low level voltage. A second word line operating voltage is applied to the word line.

The invention provides a method of reading a dynamic random access memory including the following steps. An equalizing voltage is applied to the bit line and a shield voltage is applied to the shield conductor layer before performing reading. The equalizing voltage and the shield voltage are respectively smaller than a bit line high level voltage and larger than a bit line low level voltage. The bit line high level voltage is a voltage applying to the bit line when storing the first logic level. The bit line low level voltage is a voltage applying to the bit line when storing the second logic level. A word line operating voltage is applied to the word line to perform reading the dynamic random access memory.

Based on the above, in the dynamic random access memory and the methods of manufacturing, writing and reading the same provided by the invention, the parasitic capacitance of the bit line can be reduced by the shield conductor layer. Thereby, the resistance capacitance delay (RC-delay) can be reduced, and the dynamic random access memory can have enough sensing margins. Accordingly, the dynamic random access memory can have higher reliability and is conducive to apply to the low power dynamic random access memory structure. In addition, the method of manufacturing the dynamic random access memory provided by the invention can be easily integrated with the existing processes.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2J are cross-sectional views taken along a section line A-A' in FIG. 1A to FIG. 1J.

FIG. 3A to FIG. 3J are cross-sectional views taken along a section line B-B' in FIG. 1A to FIG. 1J.

FIG. 4A to FIG. 4J are cross-sectional views taken along a section line C-C' in FIG. 1A to FIG. 1J.

FIG. 5A to FIG. 5J are cross-sectional views taken along a section line D-D' in FIG. 1A to FIG. 1J.

FIG. 8 is a read operation flowchart of the dynamic random access memory 10 according to an embodiment of the invention.

DESCRIPTION OF THE EMBODIMENTS

Figure 1A:
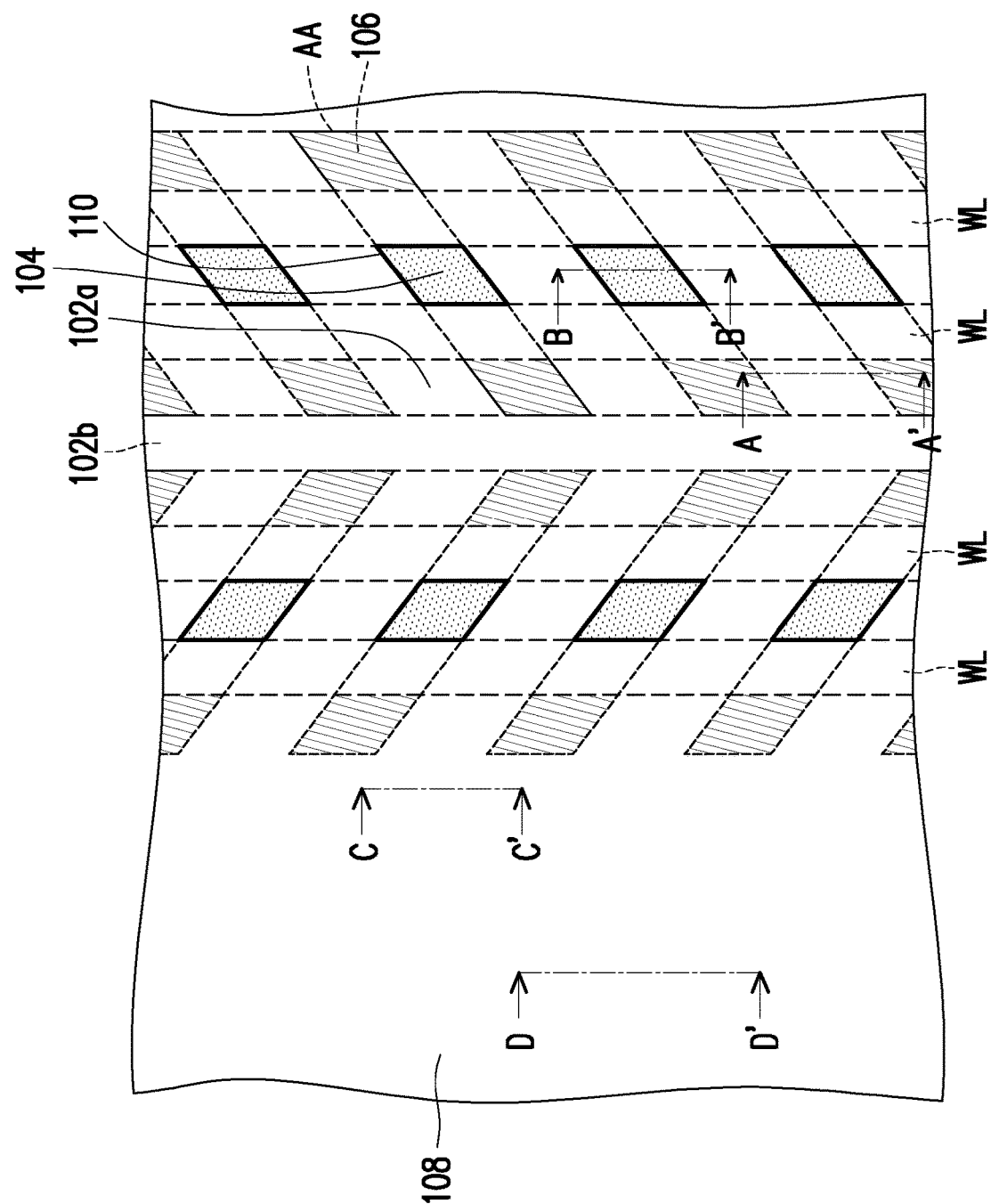
FIG. 1A to FIG. 1J are top views of a manufacturing process of a dynamic random access memory according to an embodiment of the invention.
Figure 1B:
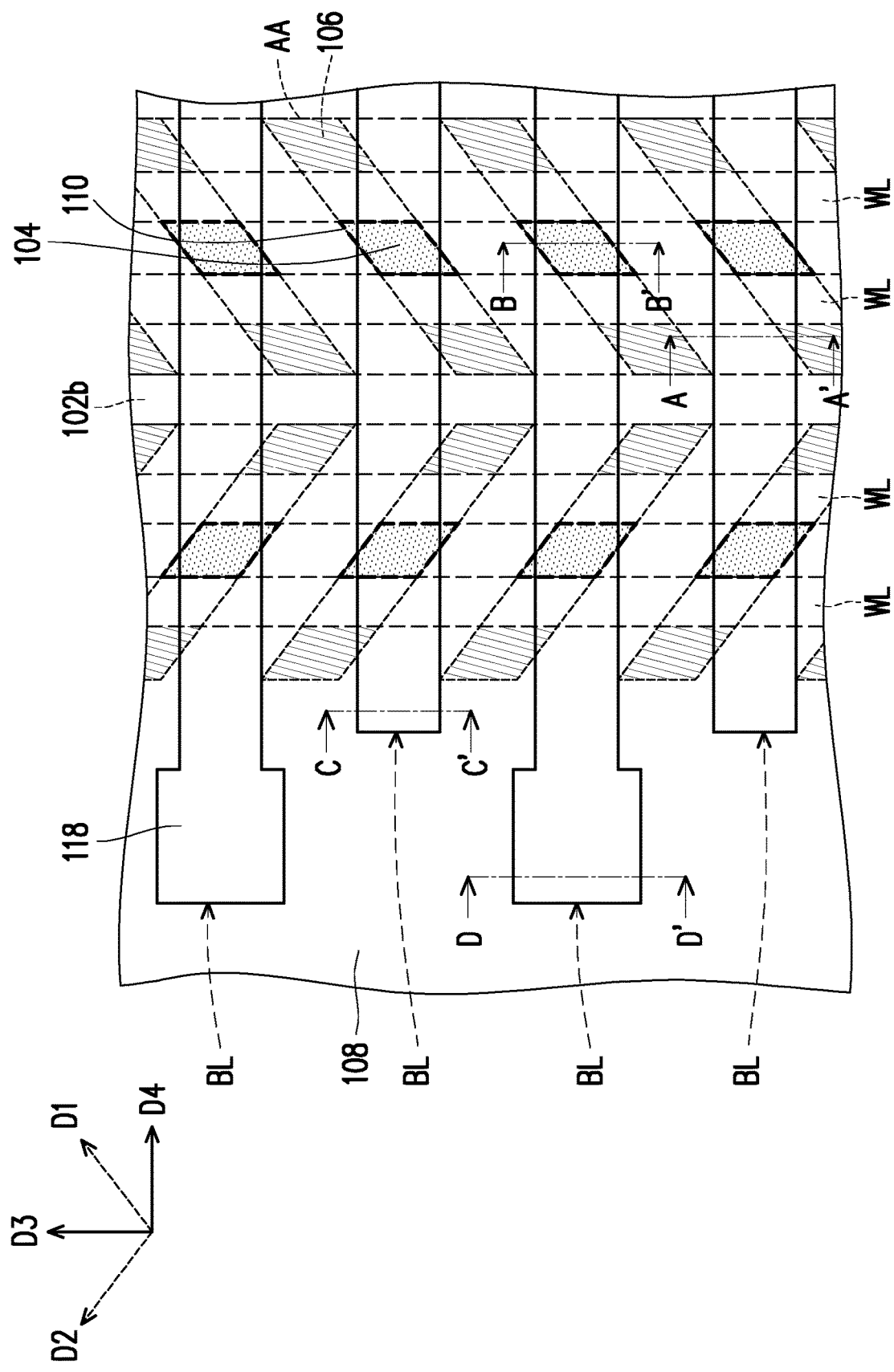
Figure 1C:
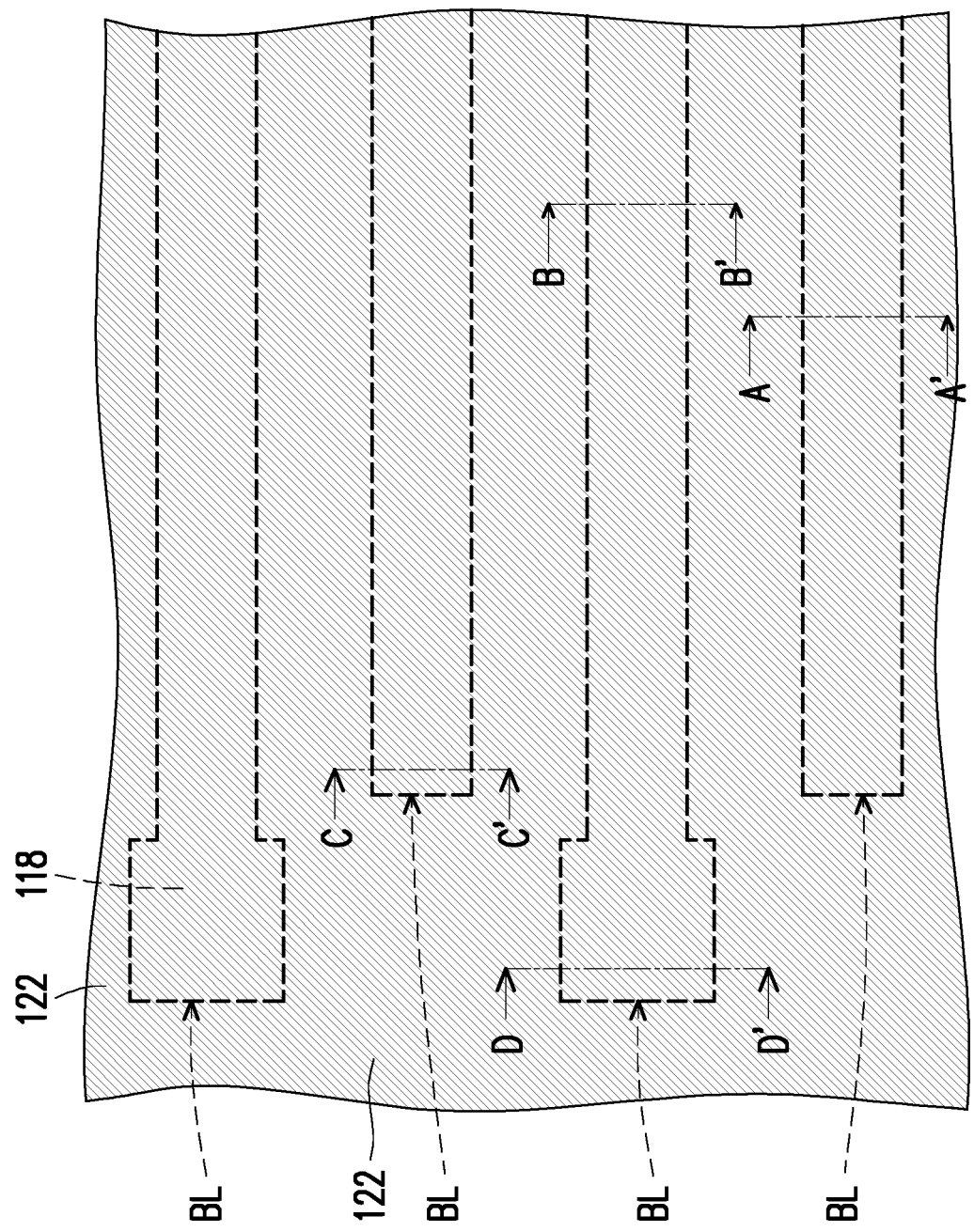
Figure 1D:
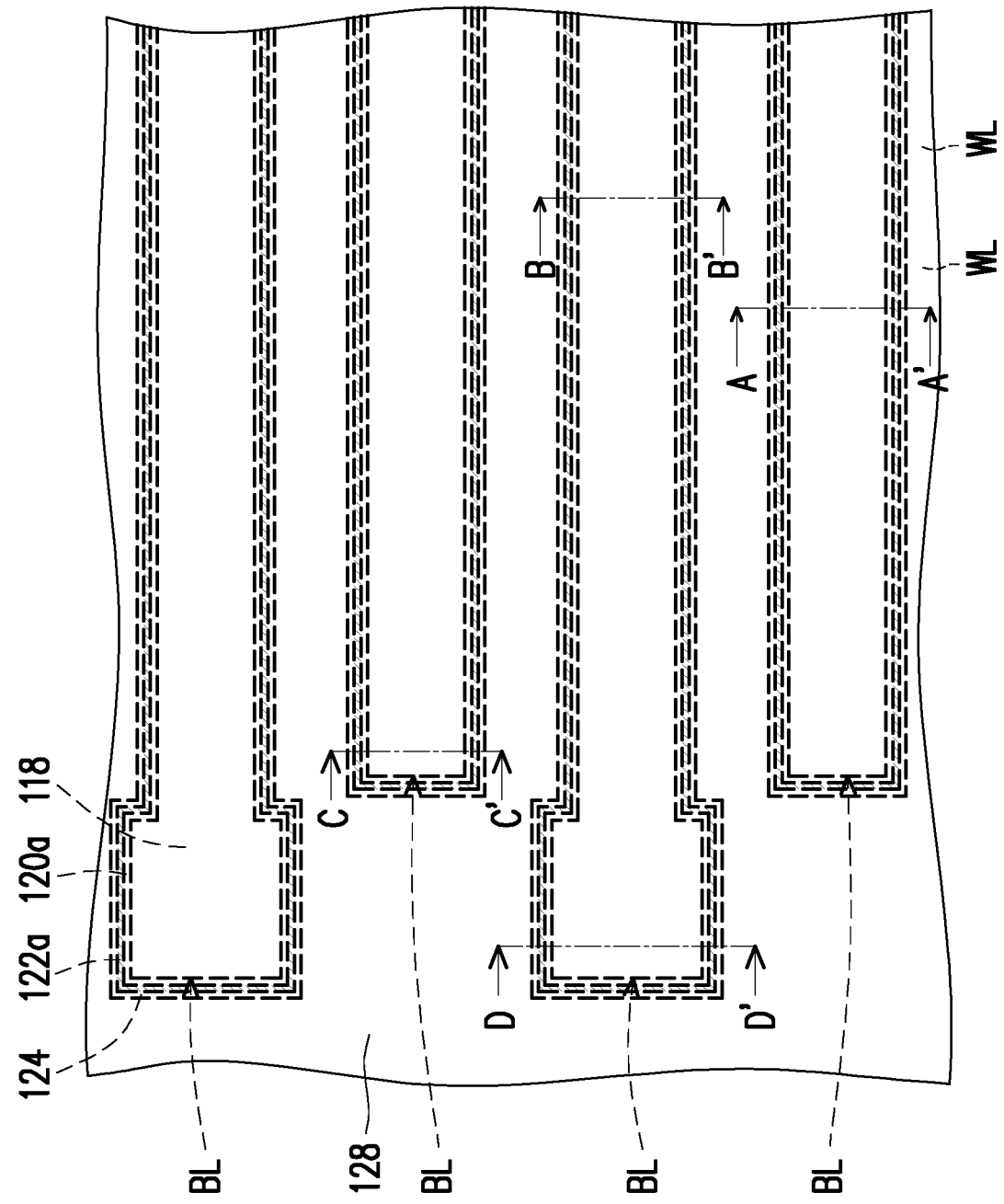
Figure 1E:
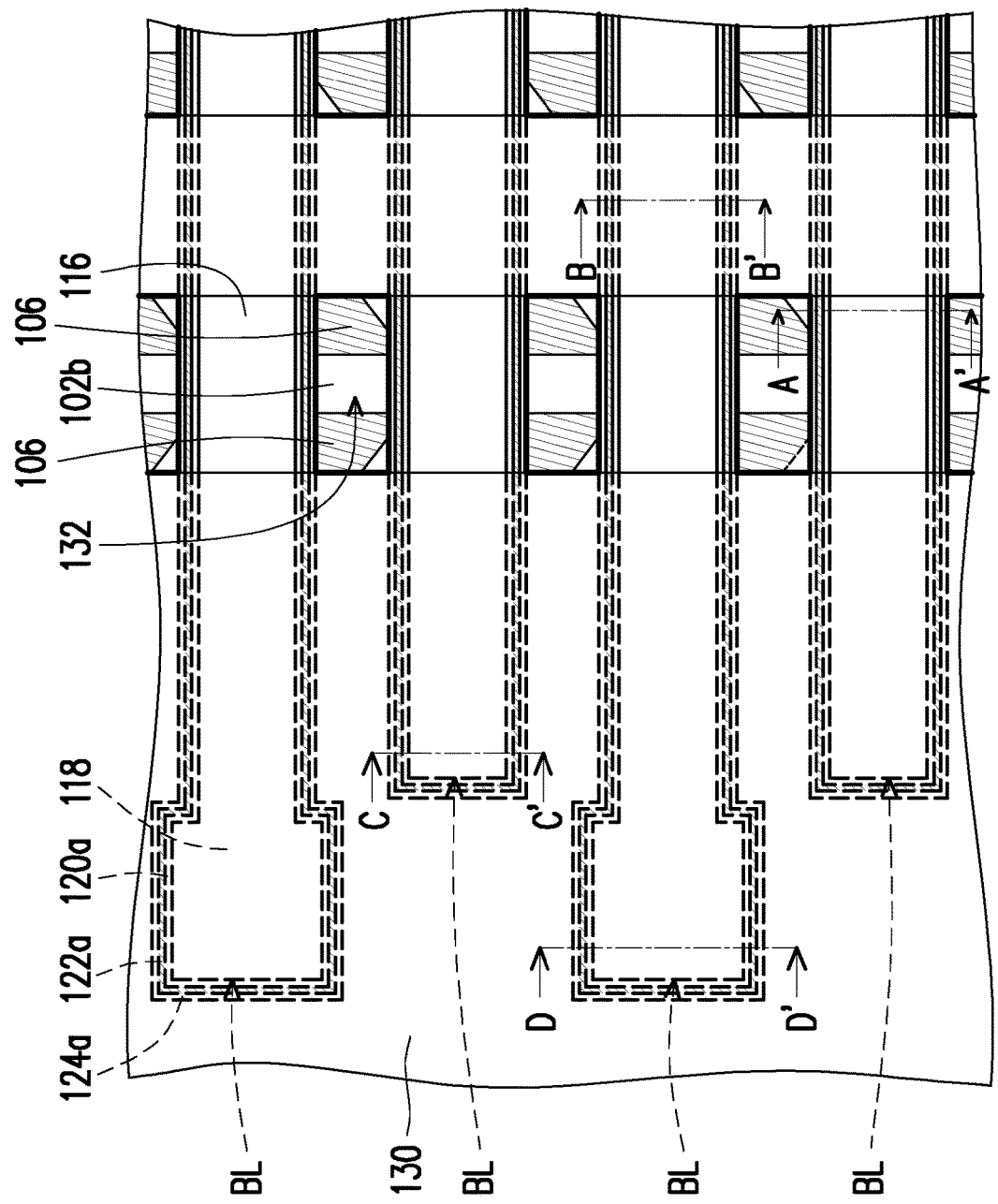
Figure 1F:
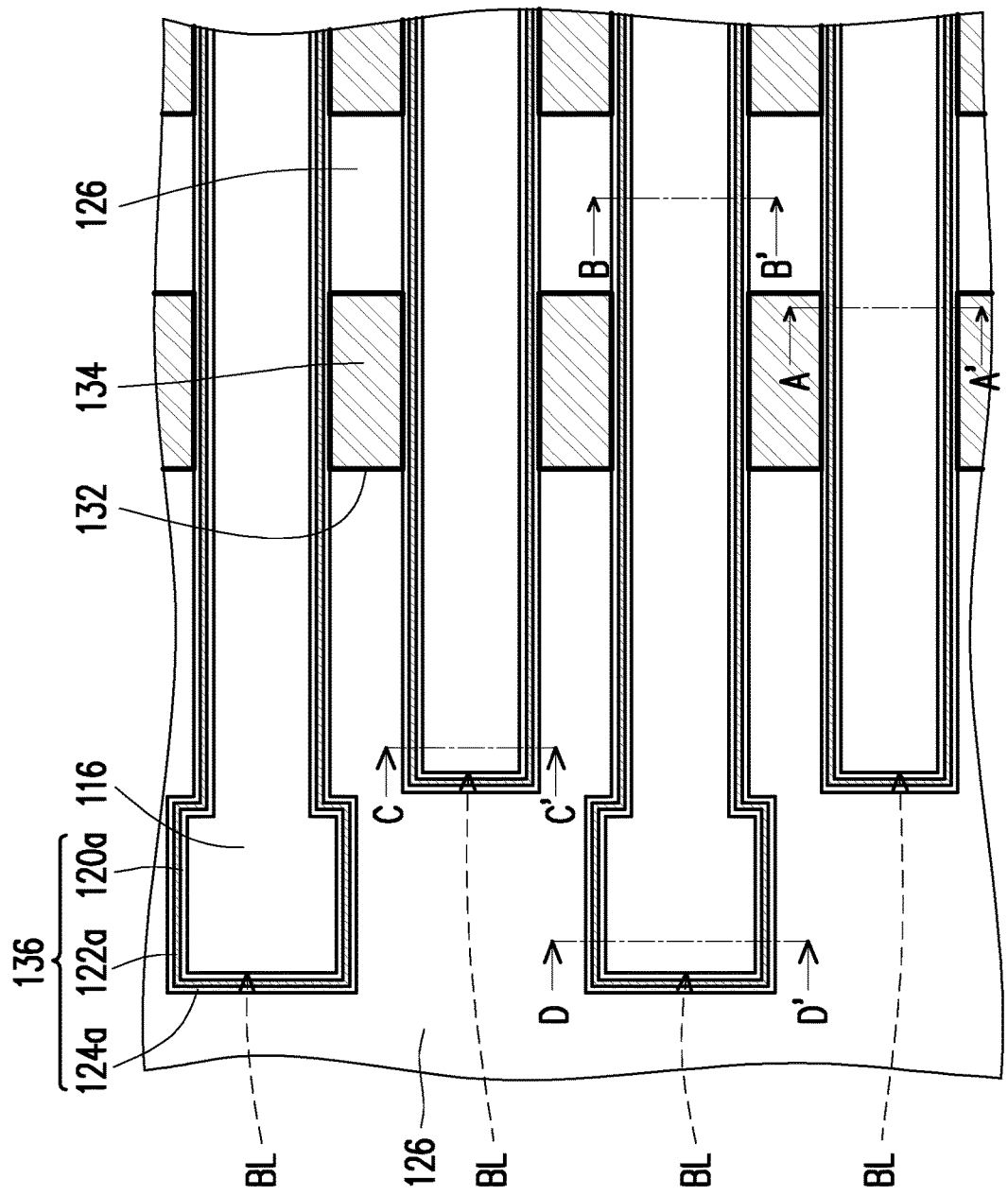
Figure 1G:
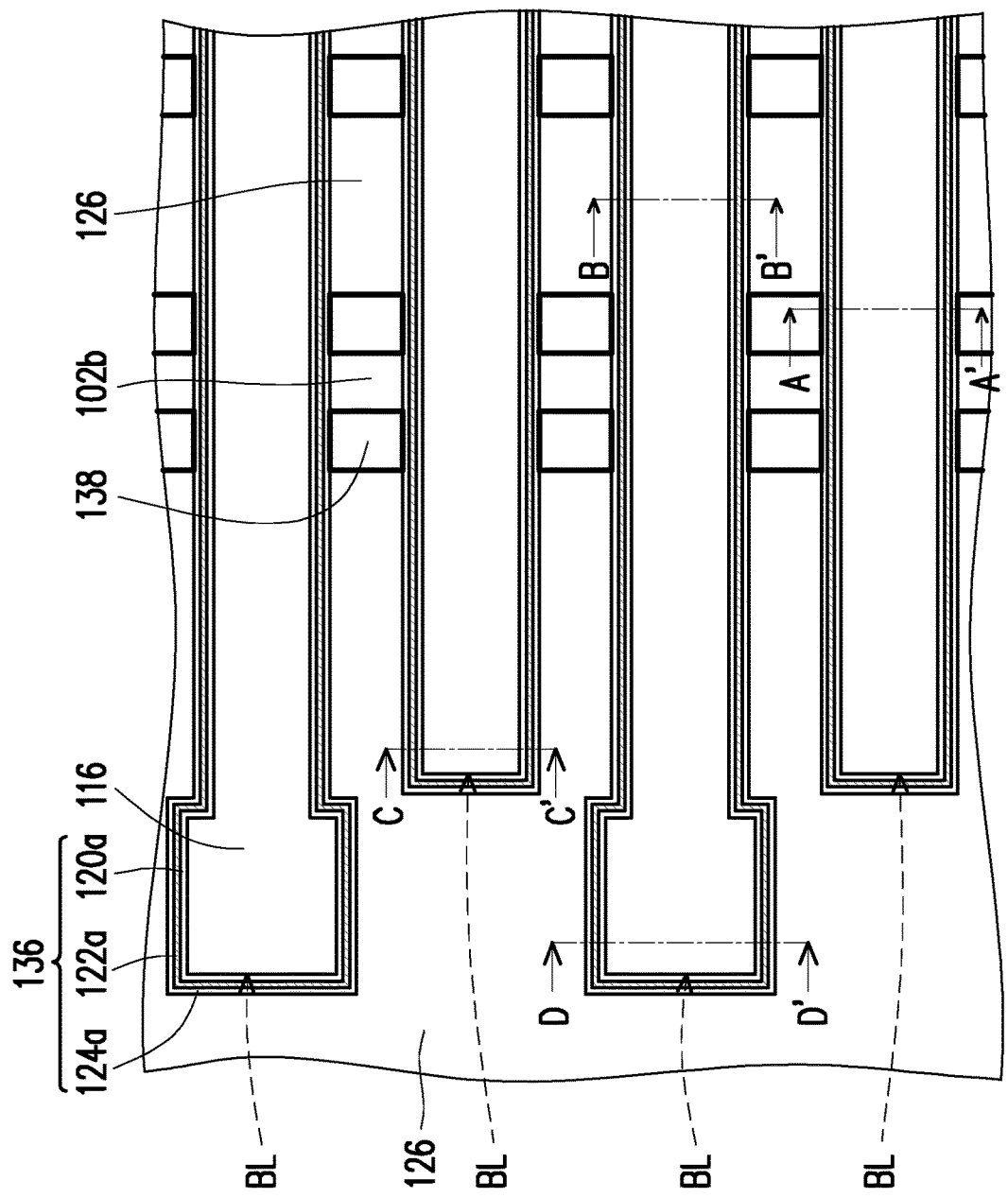
Figure 1H:
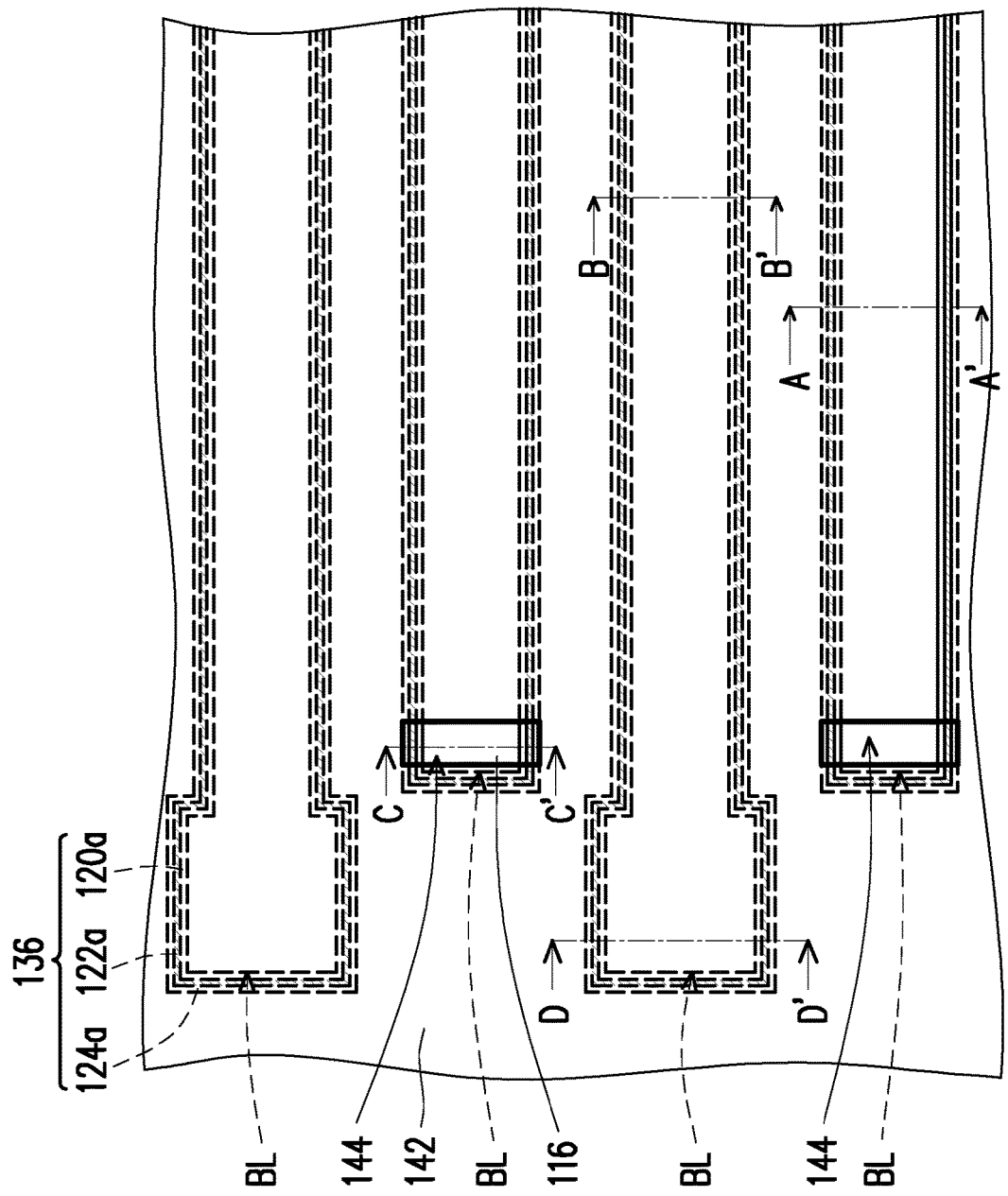
Figure 1I:
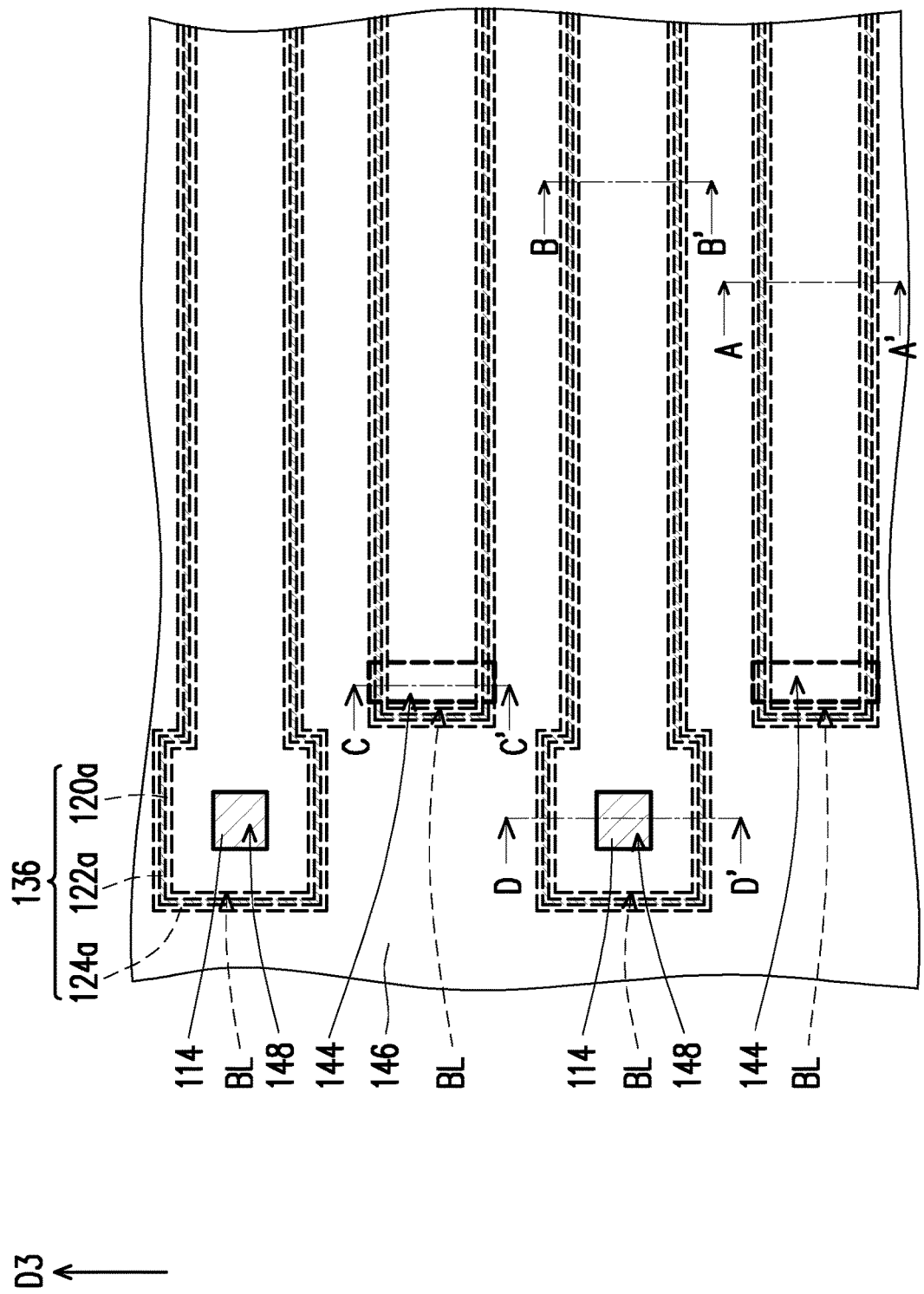
Figure 1J:
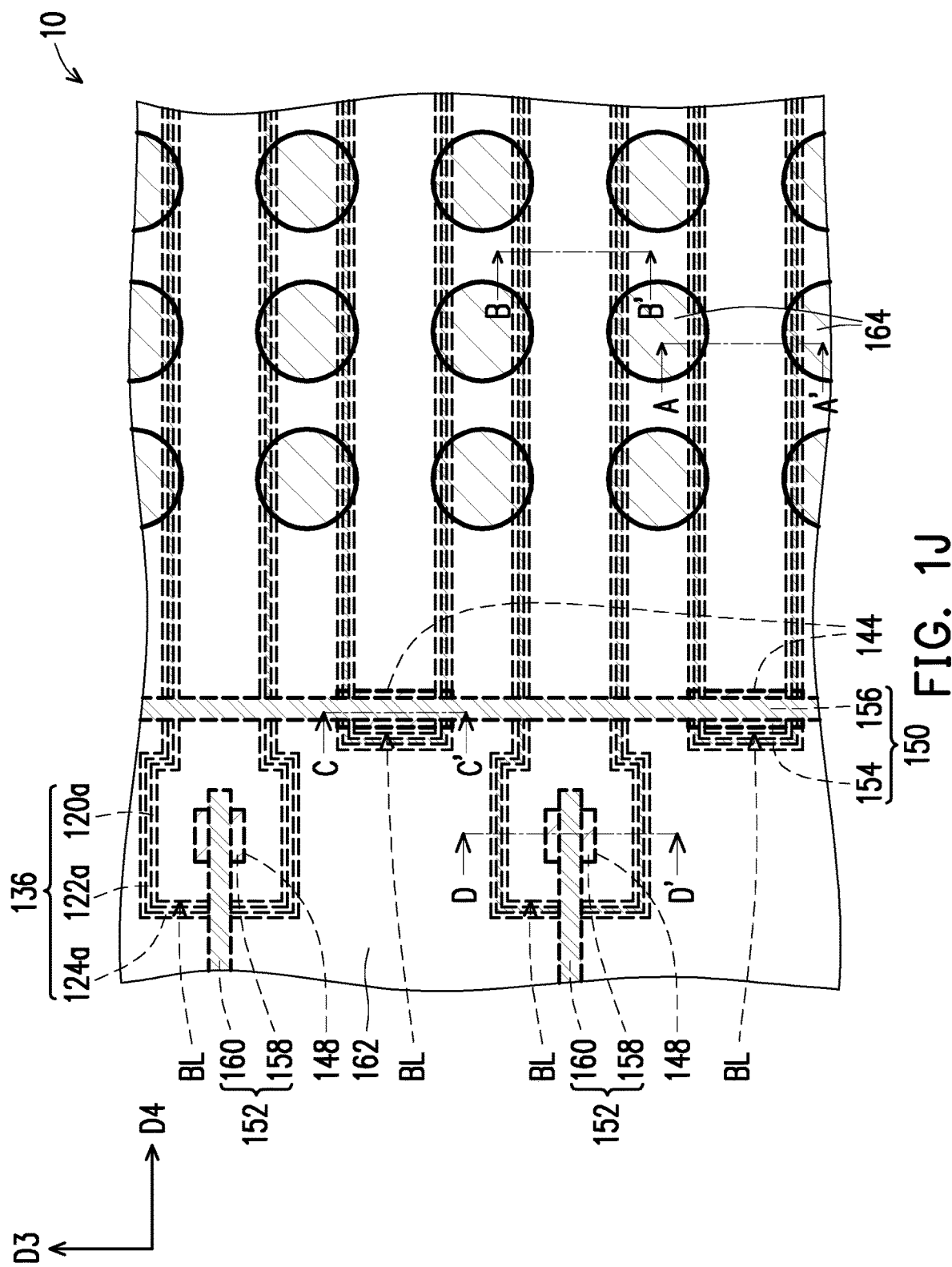
Figure 3A:
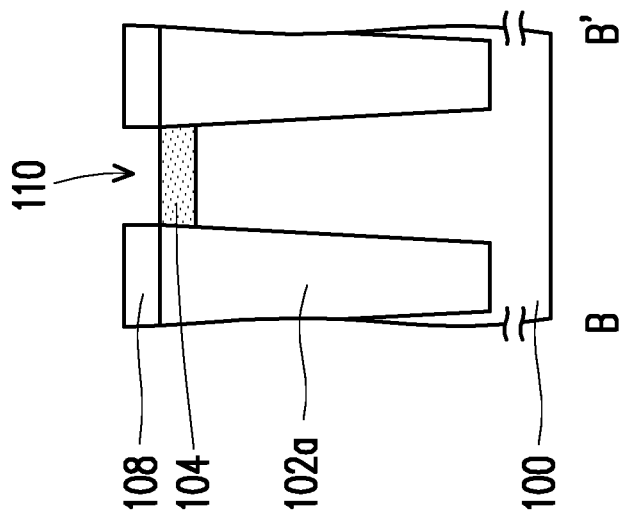
Figure 2A:
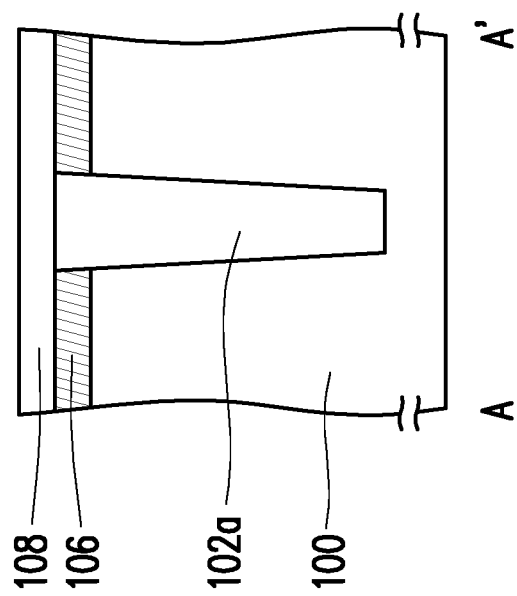
Figure 3B:
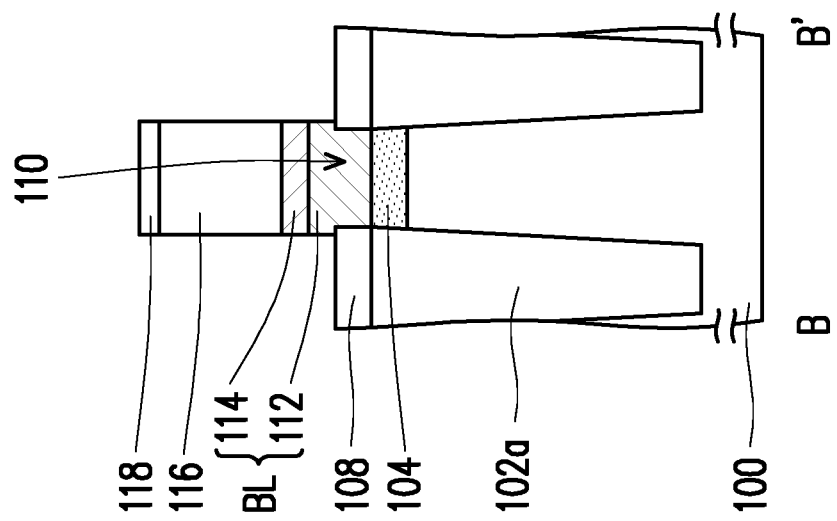
Figure 2B:
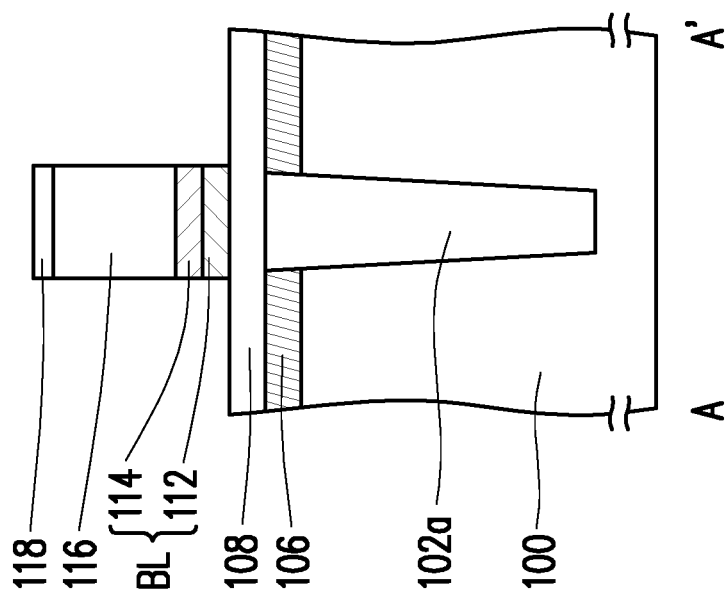
Figure 3C:
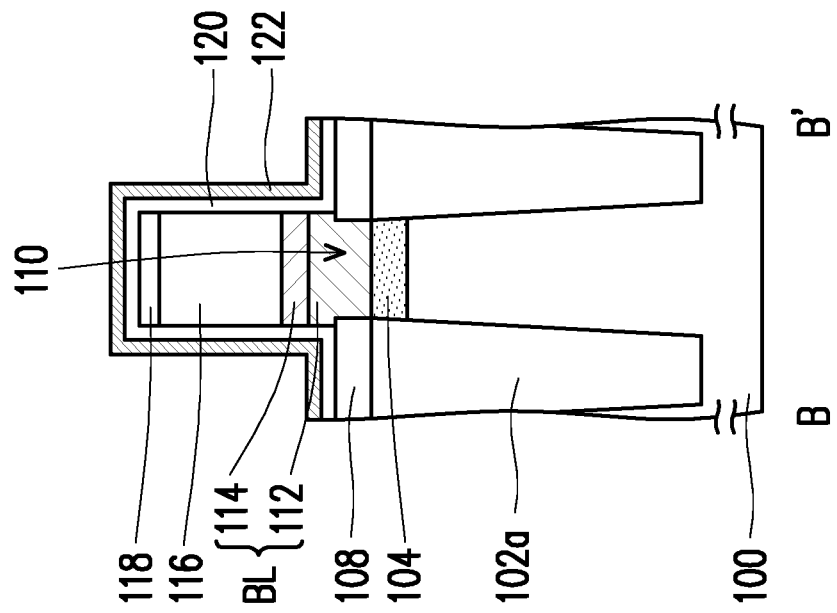
Figure 2C:
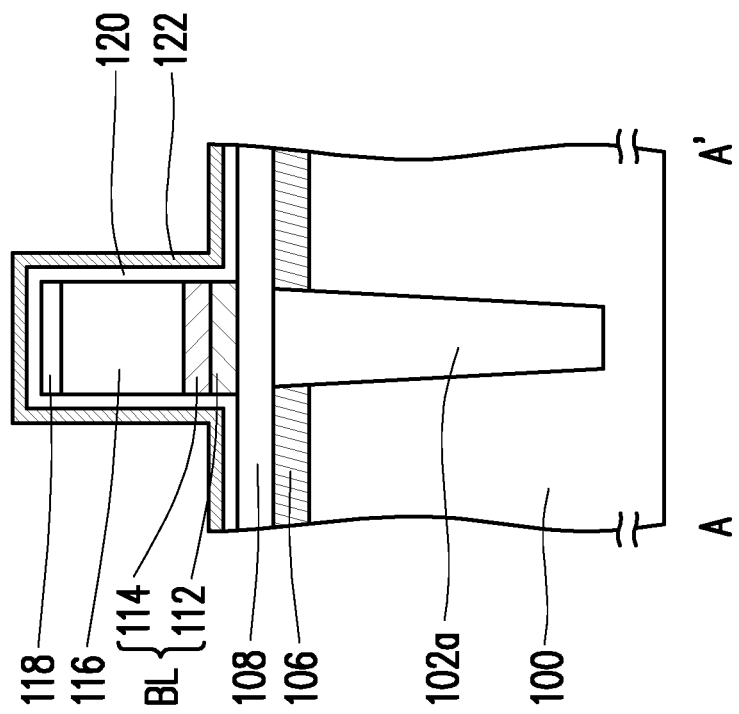
Figure 3D:
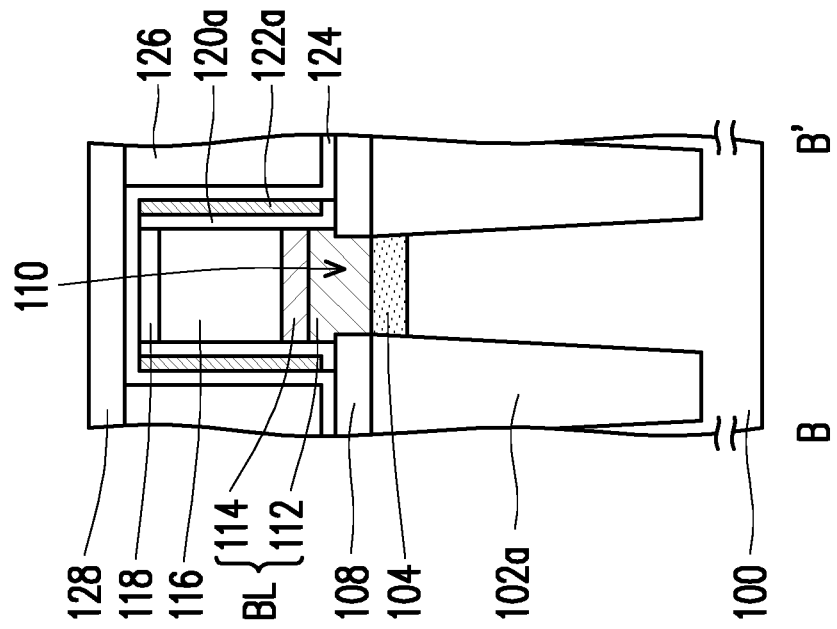
Figure 2D:
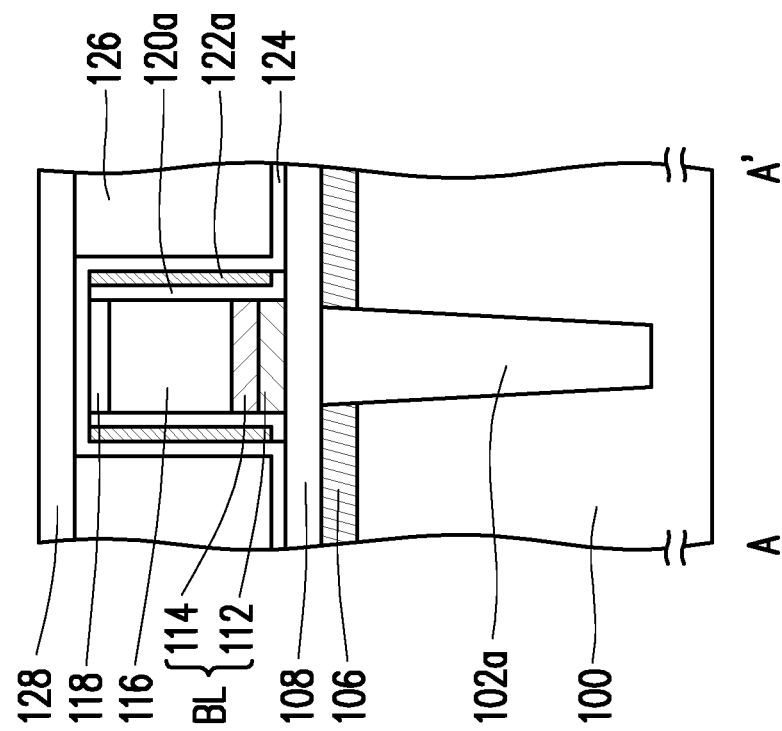
Figure 3E:
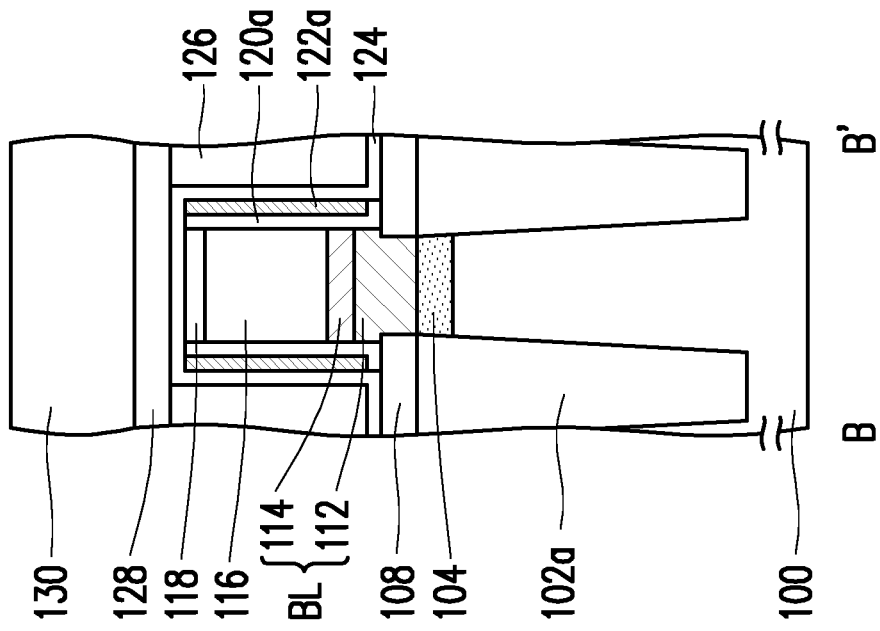
Figure 2E:
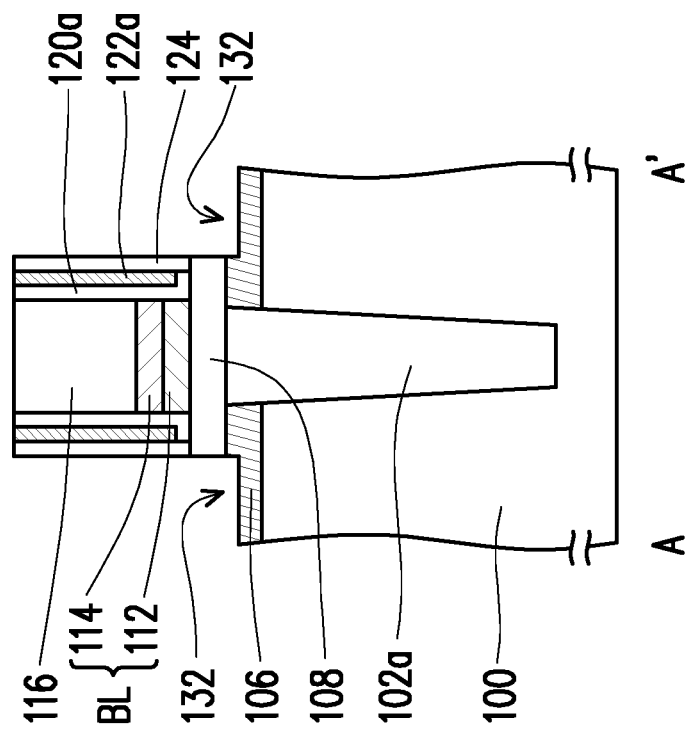
Figures 2G, 3G:
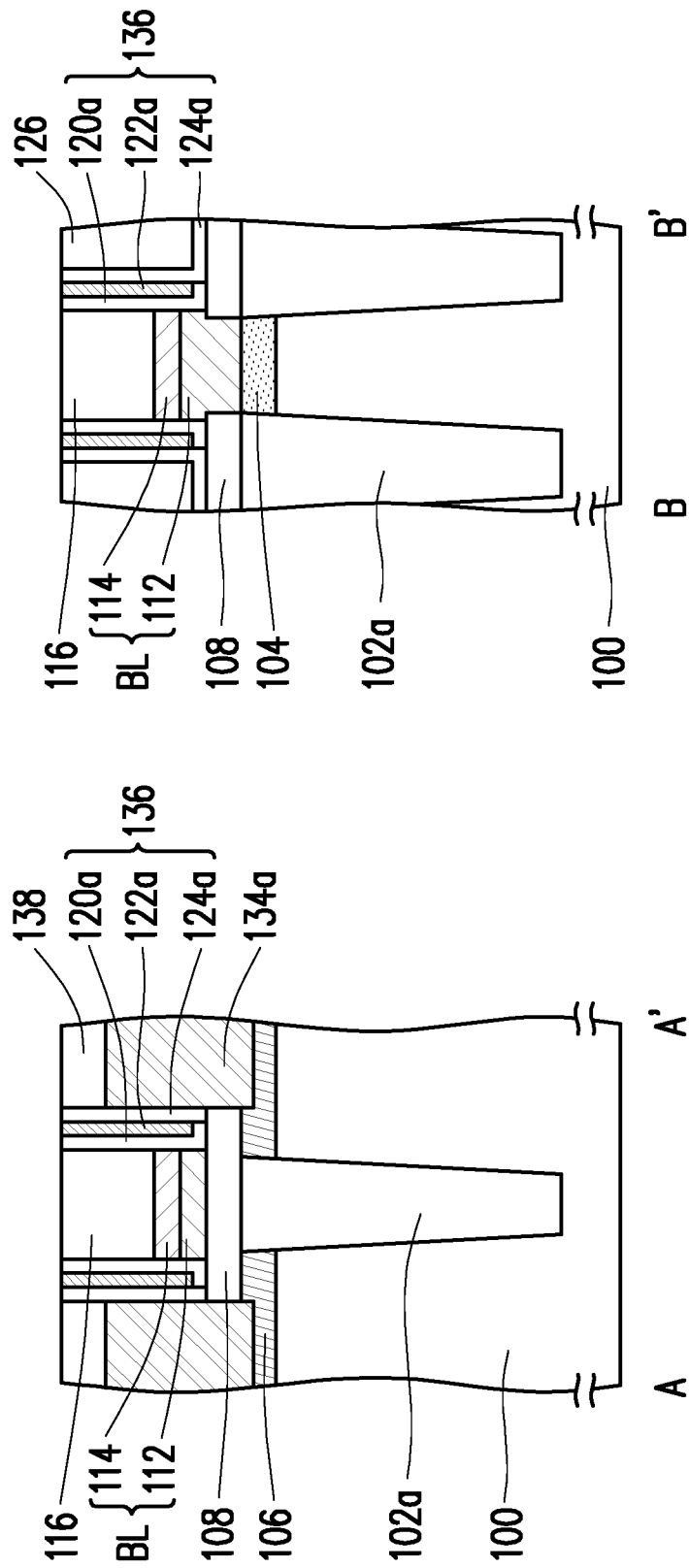
Figure 3H:
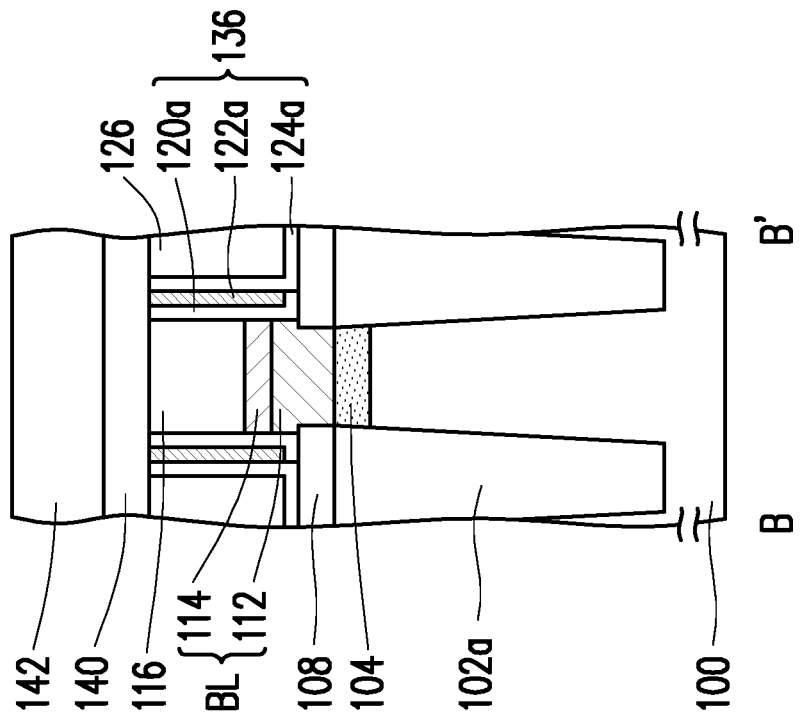
Figure 2H:
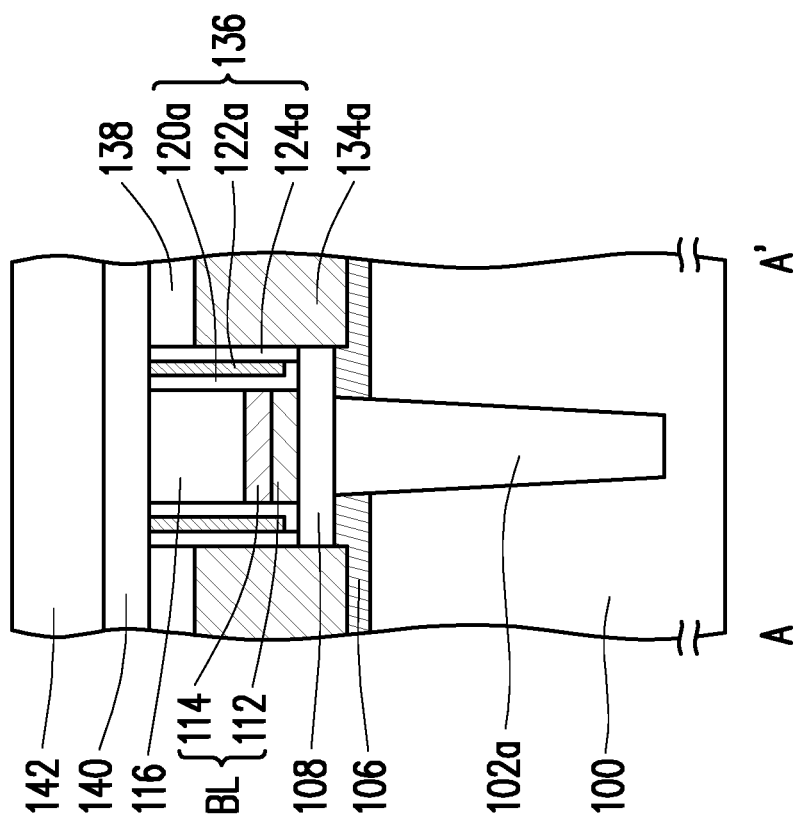
Figure 2I:
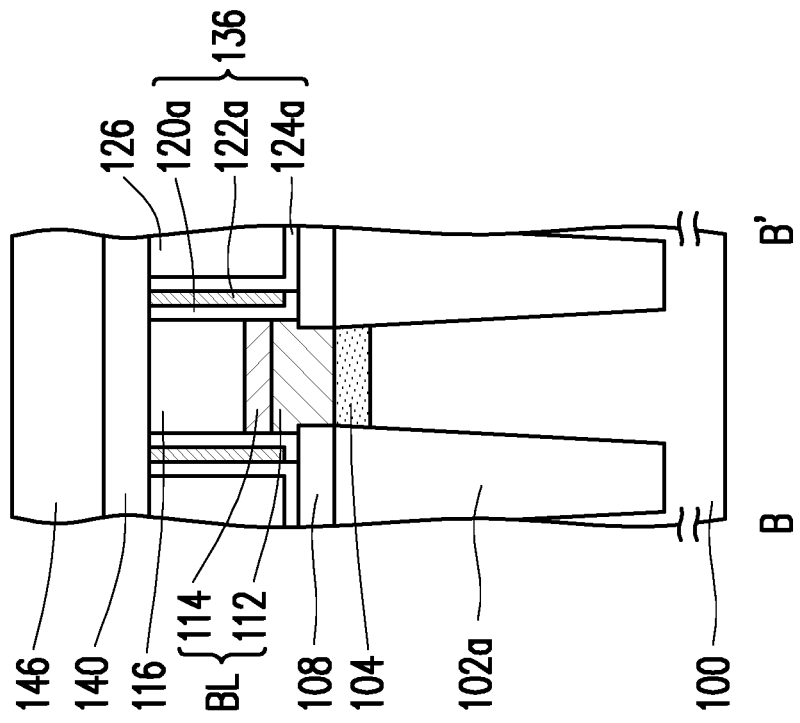
Figure 3I:
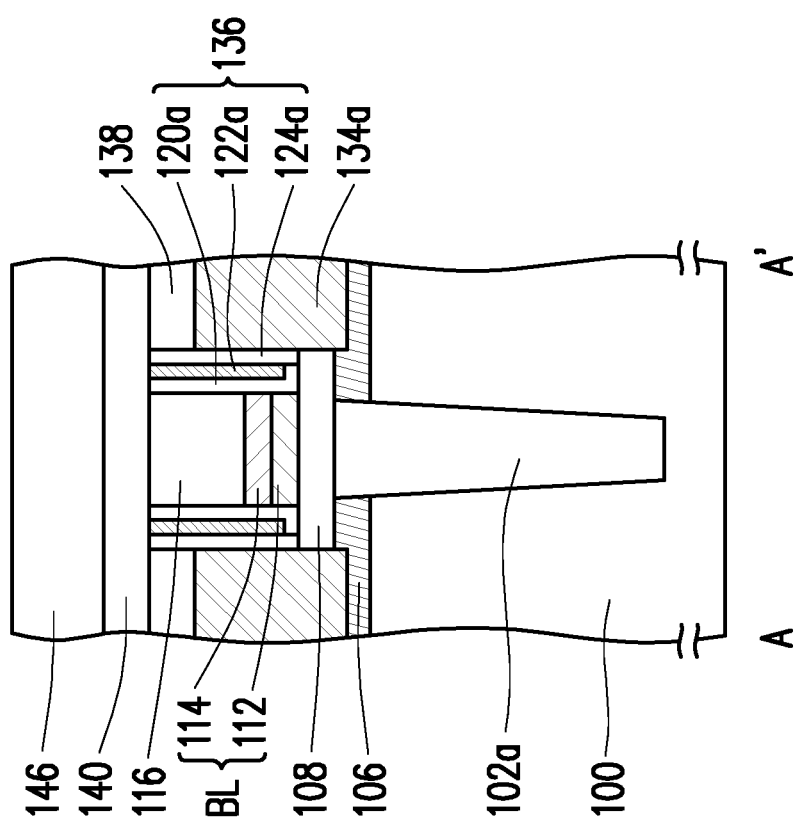
Figure 3J:
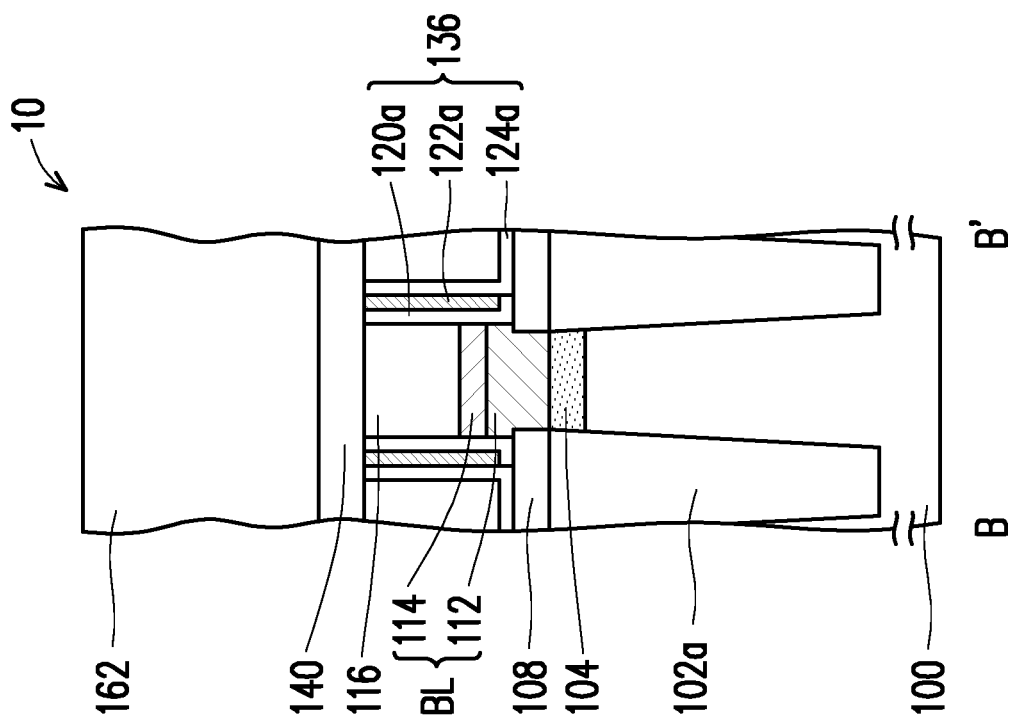
Figure 2J:
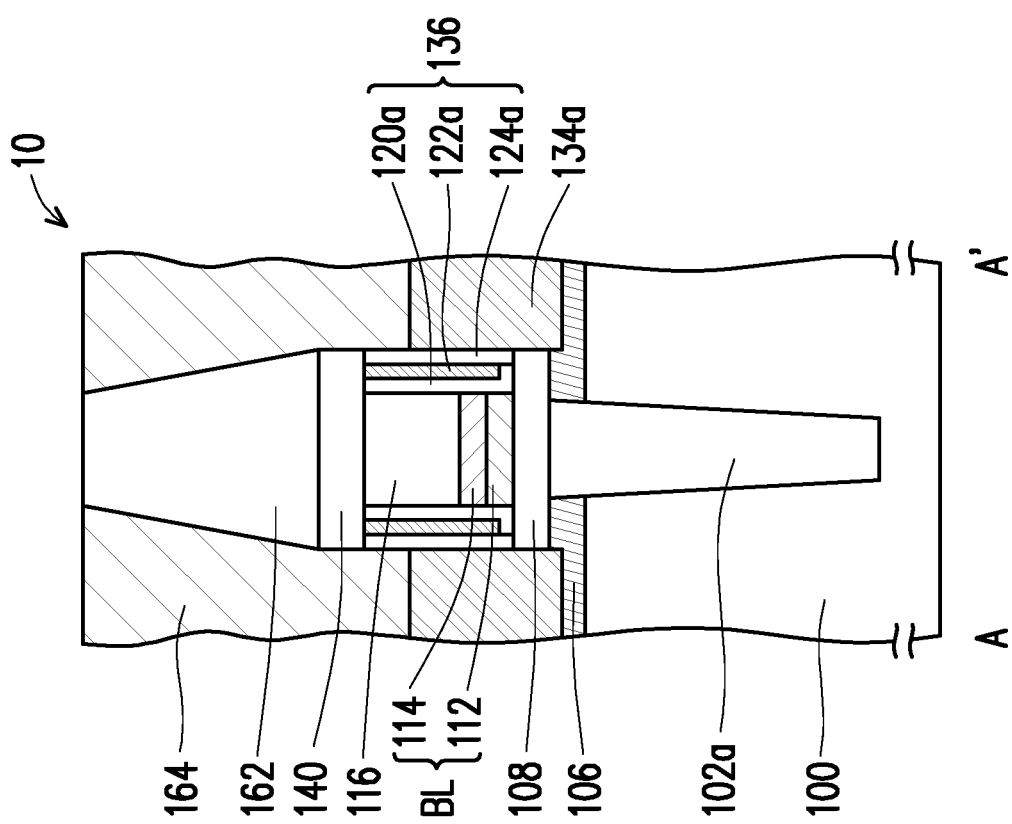
Figure 5A:
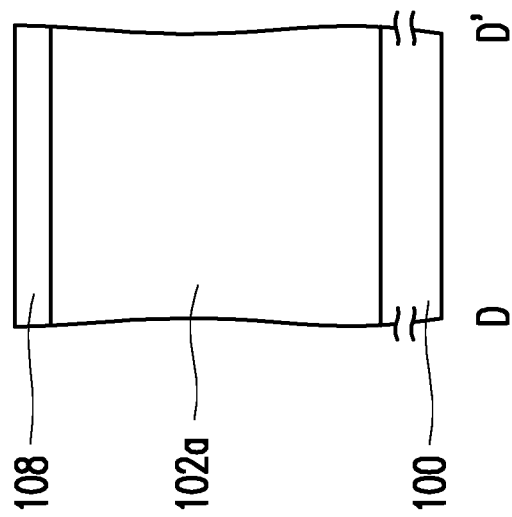
Figure 4A:
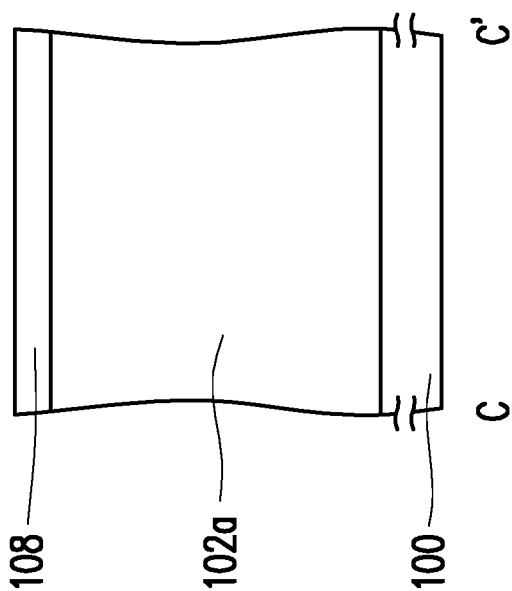
Figure 5B:
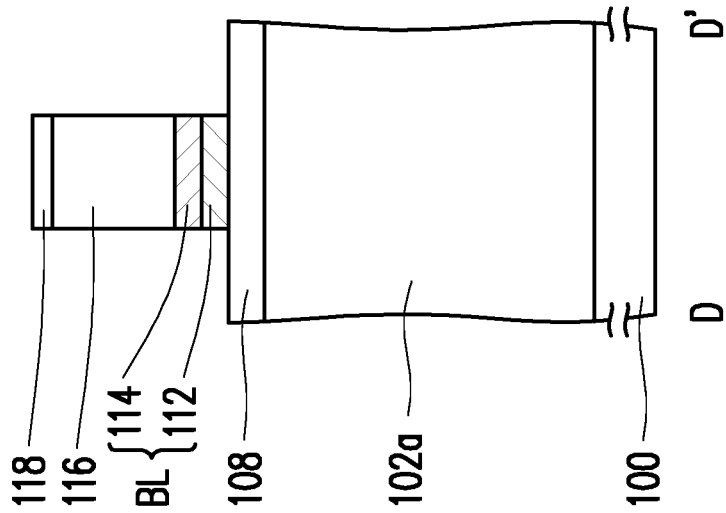
Figure 4B:
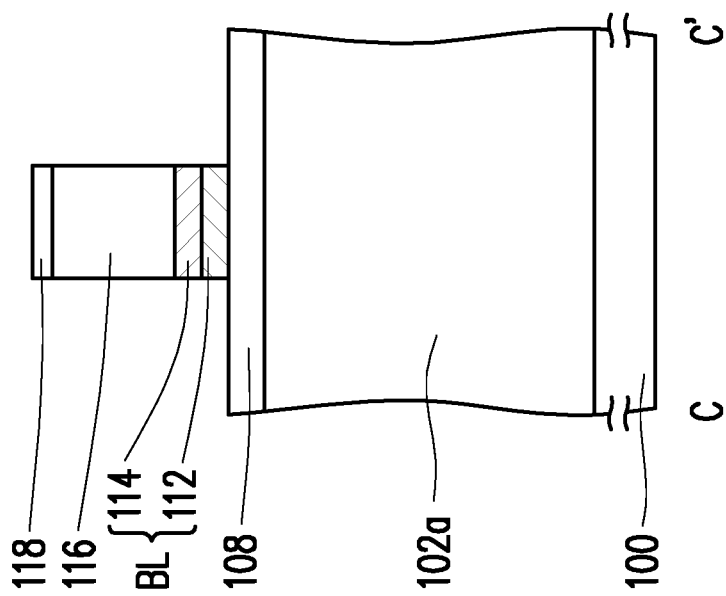
Figure 4C:
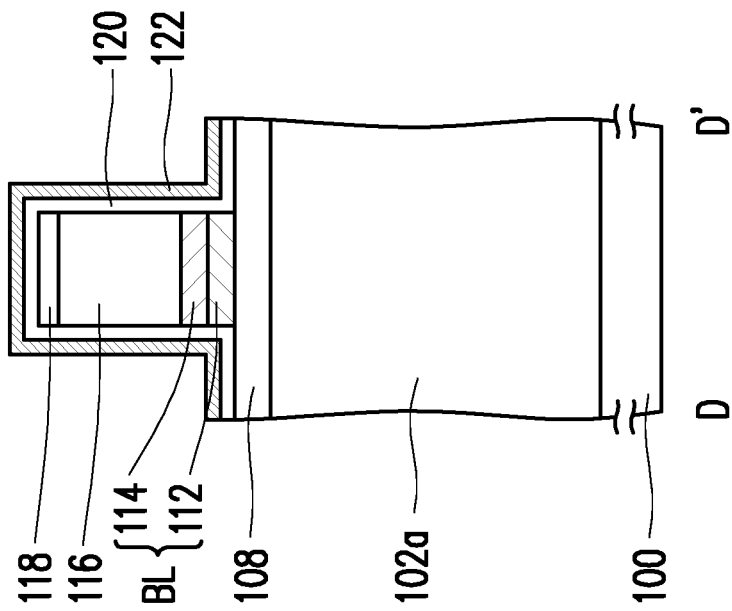
Figure 5C:
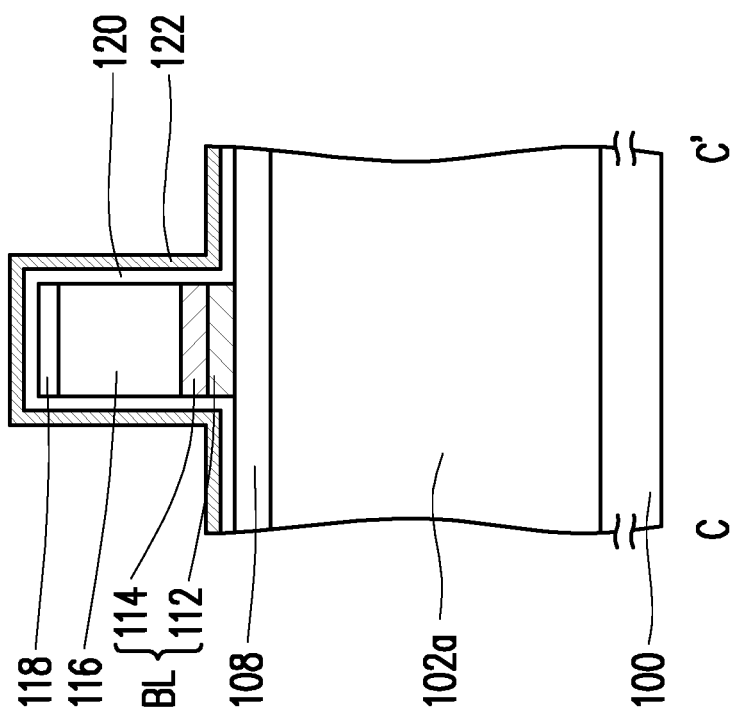
Figure 4D:
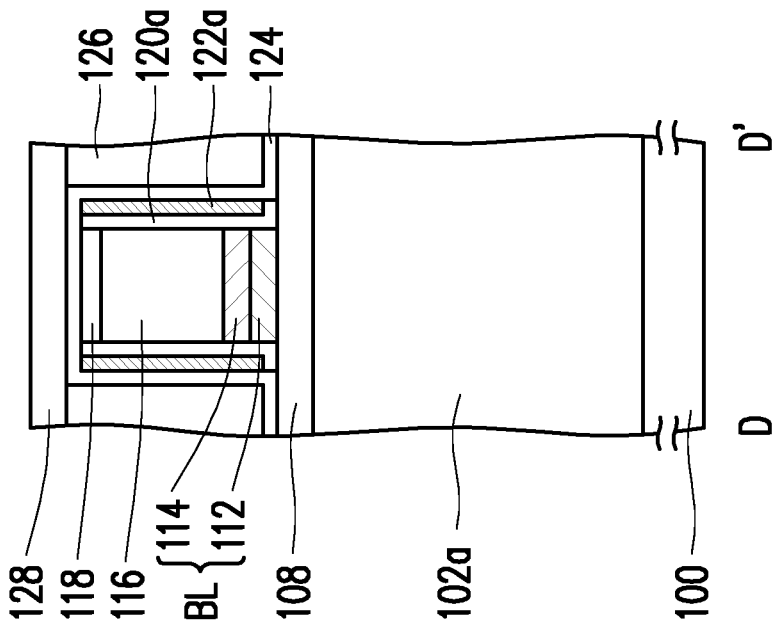
Figure 5D:
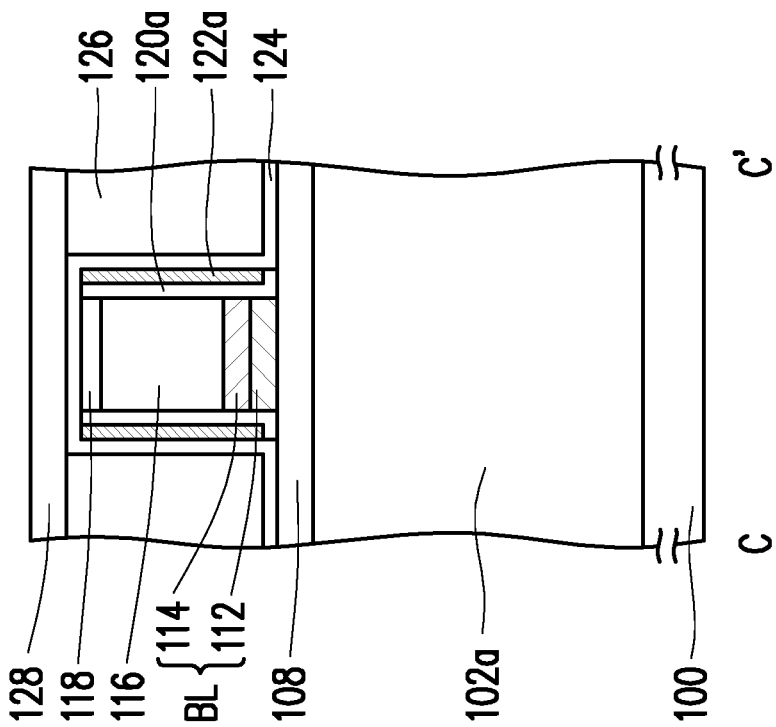
Figure 4E:
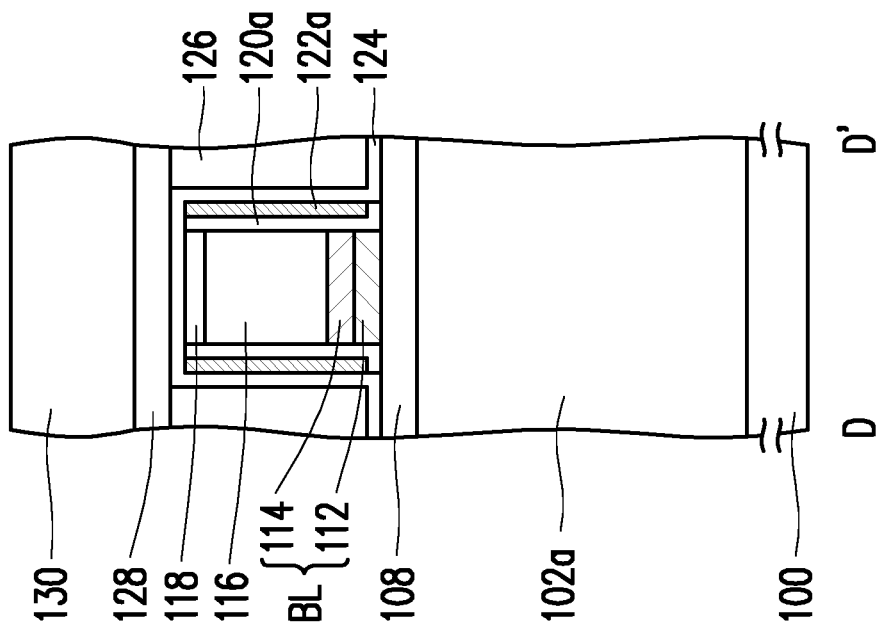
Figure 5E:
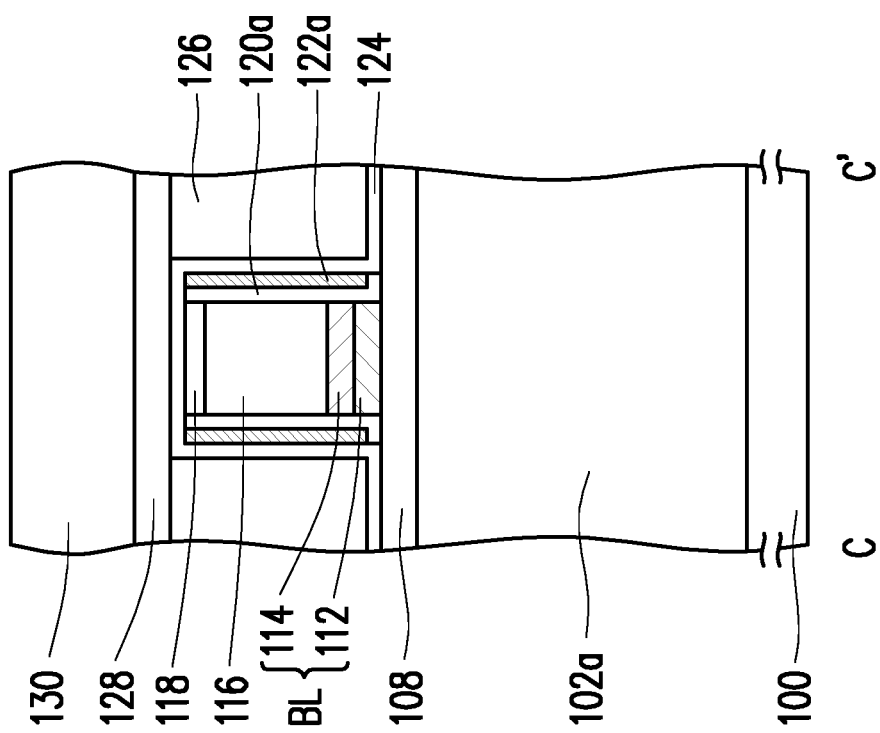
Figure 5F:
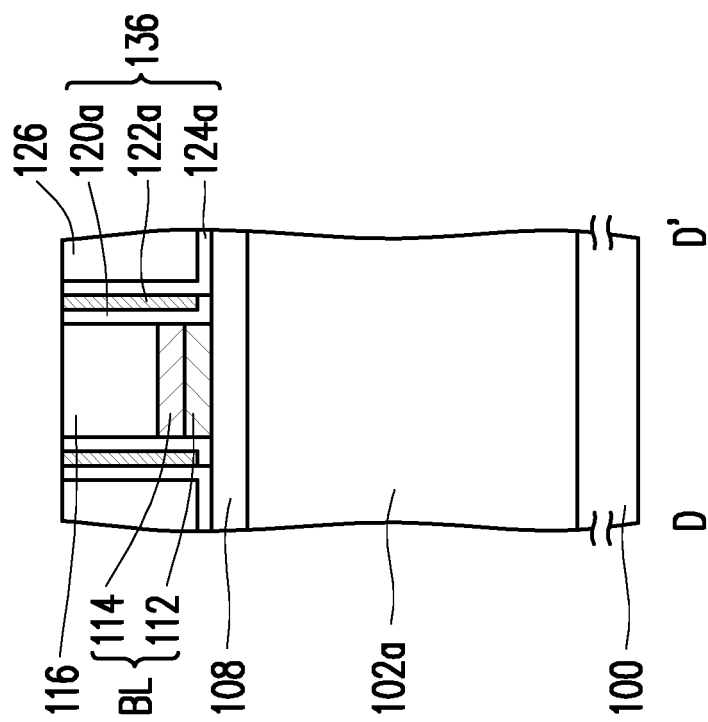
Figure 4F:
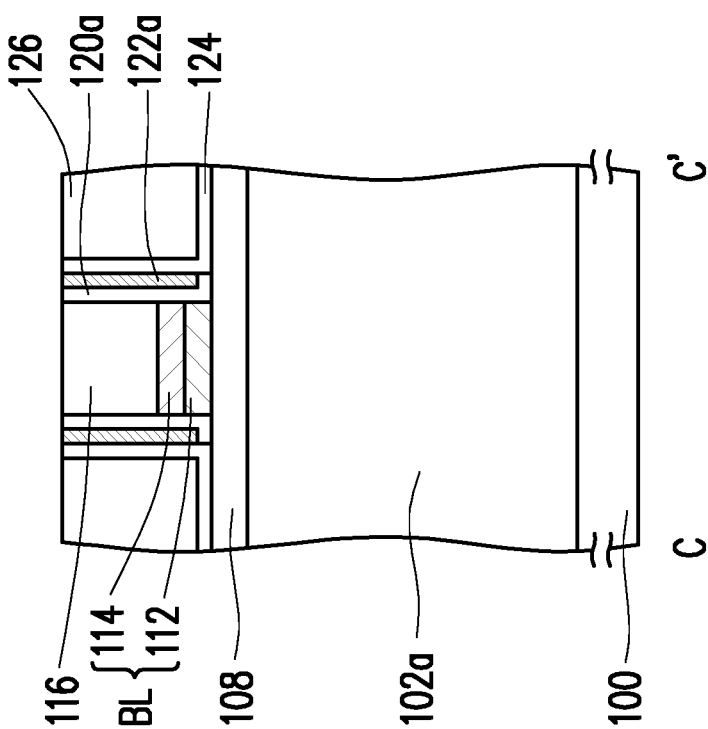
Figure 5G:
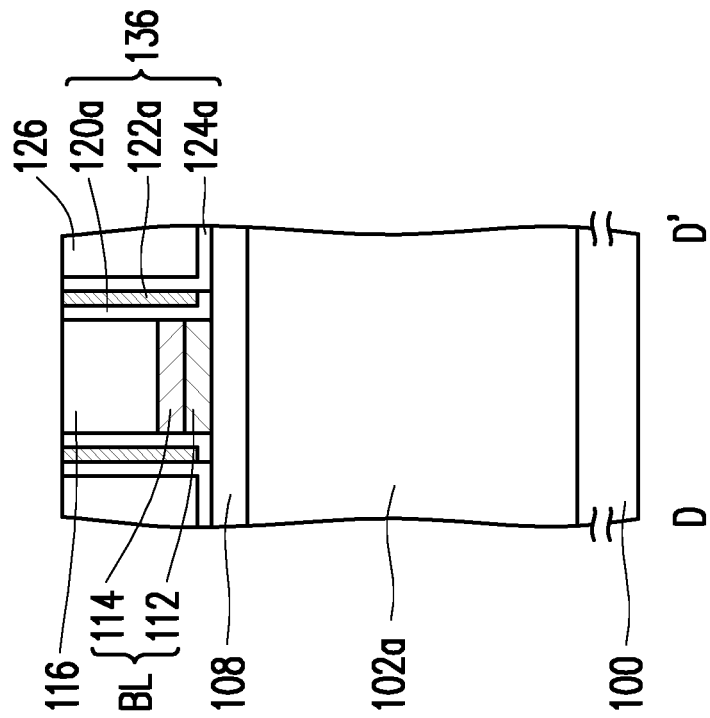
Figure 4G:
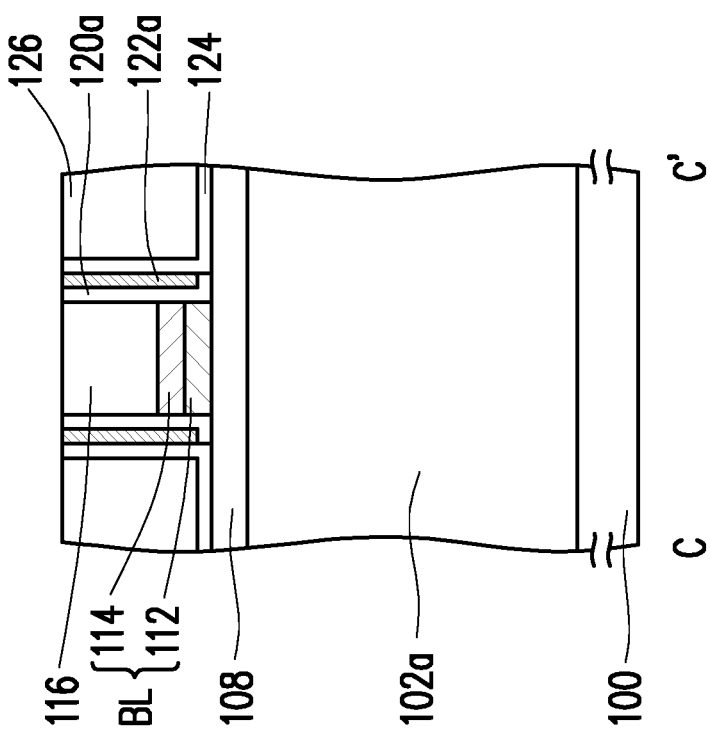
Figures 4I, 5I:
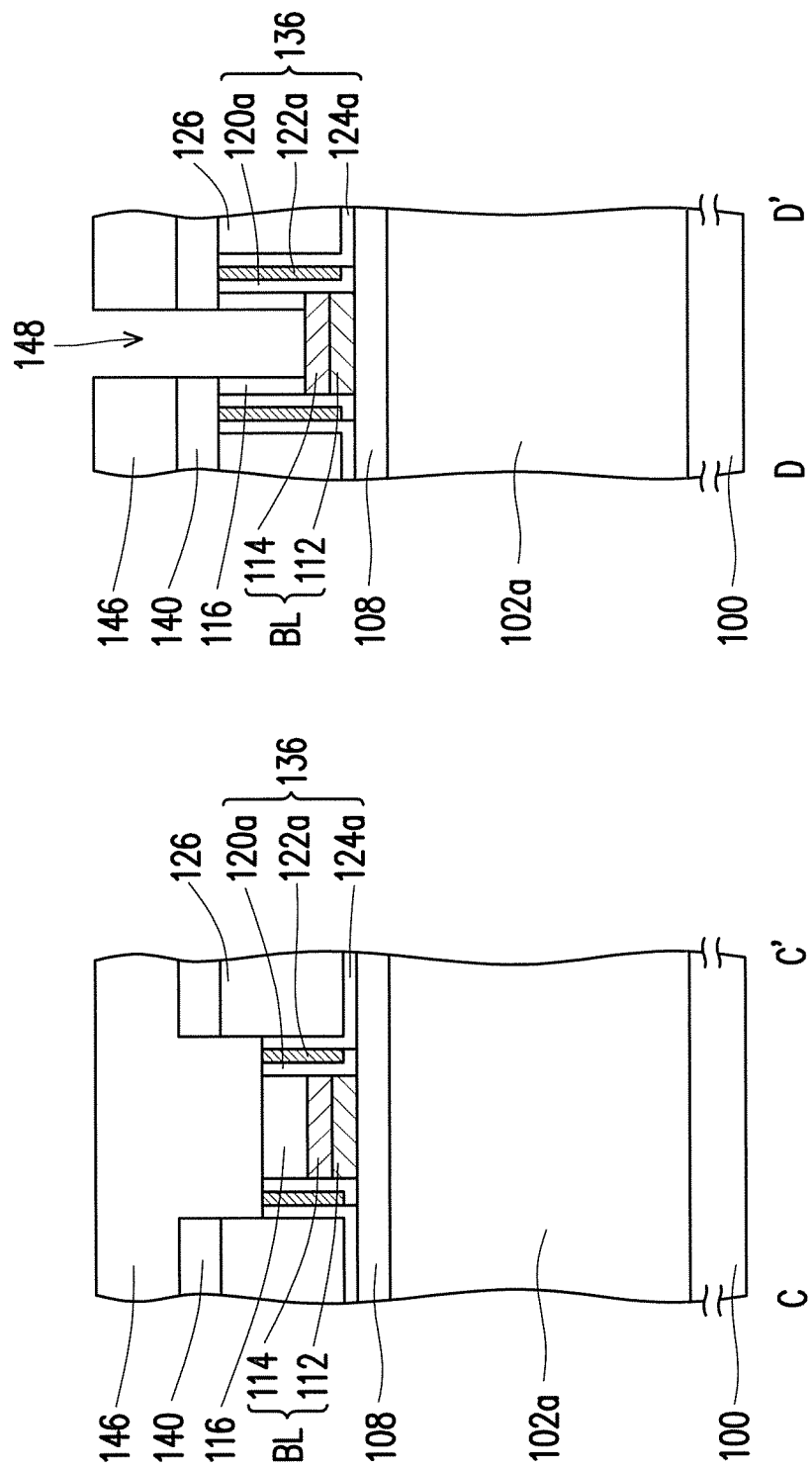
Figure 5J:
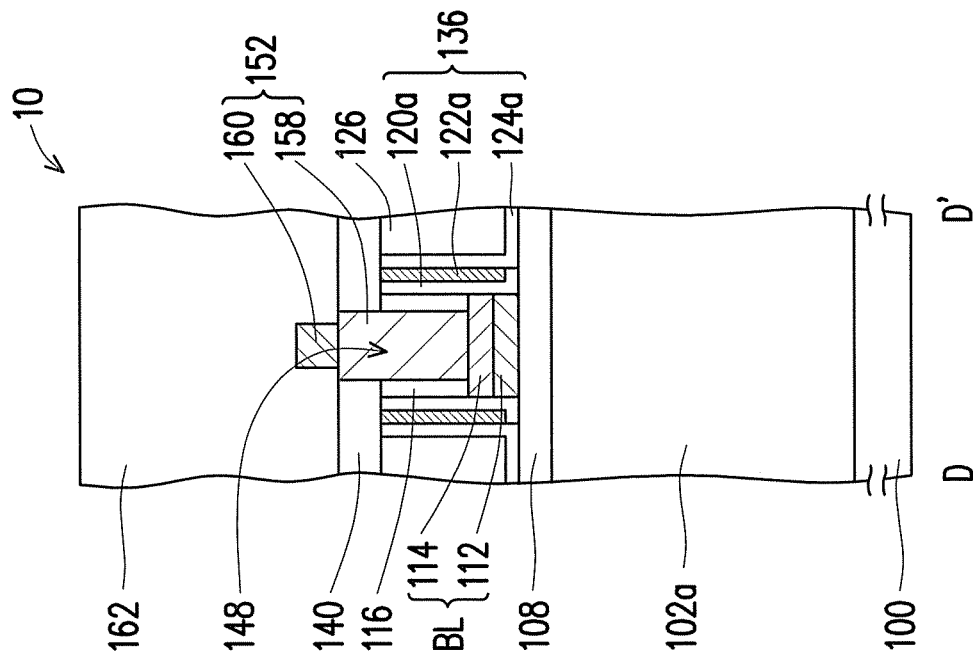
Figure 4J:
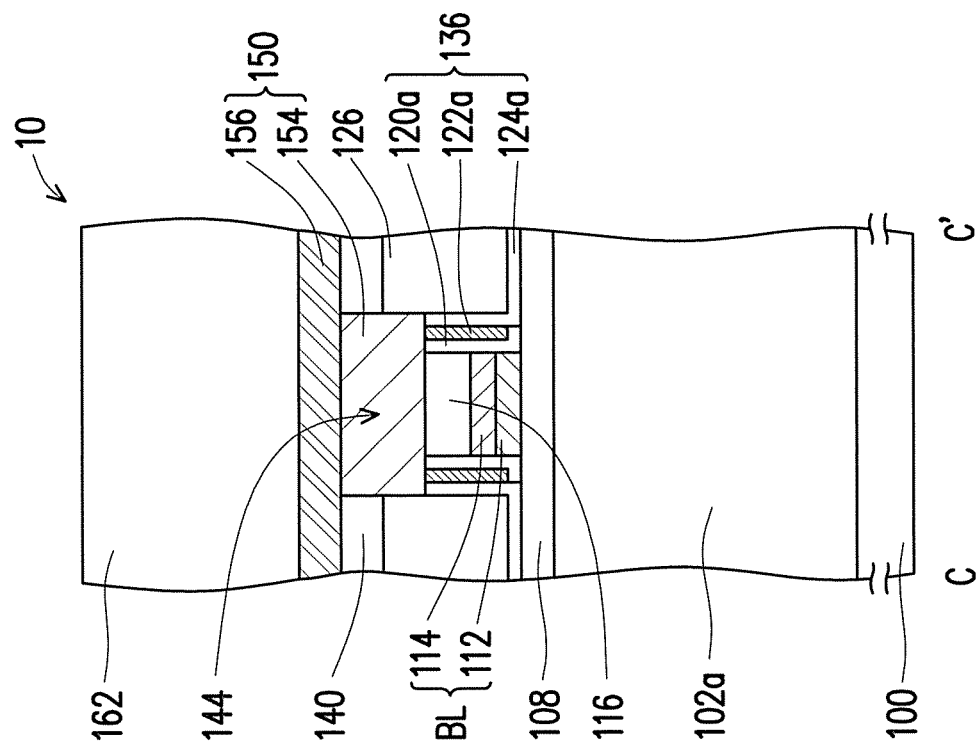

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A to FIG. 1J are top views of a manufacturing process of a dynamic random access memory according to an embodiment of the invention. FIG. 2A to FIG. 2J are cross-sectional views taken along a section line A-A' in FIG. 1A to FIG. 1J. FIG. 3A to FIG. 3J are cross-sectional views taken along a section line B-B' in FIG. 1A to FIG. 1J. FIG. 4A to FIG. 4J are cross-sectional views taken along a section line C-C' in FIG. 1A to FIG. 1J. FIG. 5A to FIG. 5J are cross-sectional views taken along a section line D-D' in FIG. 1A to FIG. 1J. In the top views of FIG. 1A to FIG. 1J, in order to clearly illustrate the relationship between each component, some components in the cross-sectional views of FIG. 2A to FIG. 5J are omitted, and only a portion of the contour of a sidewall structure is shown.

Referring to FIG. 1A, FIG. 2A, FIG. 3A, FIG. 4A and FIG. 5A, isolation structures (e.g., isolation structures 102a and isolation structures 102b) may be formed in a substrate 100 to define active regions AA. The substrate 100 is a silicon substrate, for example. Materials of the isolation structures 102a and the isolation structures 102b are silicon oxide, for example. The isolation structures 102a and the isolation structures 102b are made by a shallow trench isolation structure process, for example.

In the present embodiment, top view patterns of the active regions AA located at two sides of the isolation structures 102b may have different extension directions, but the invention is not limited thereto. For instance, the top view patterns of the active regions AA located at one side of the isolation structures 102b may be extended in a direction D1 of a positive slope, and the top view patterns of the active regions AA located at another side of the isolation structures 102b may be extended in a direction D2 of a negative slope. In another embodiment, the top view patterns of the active regions AA located at the two sides of the isolation structures 102b may also have the same extension direction.

A word line WL may be formed. The word line WL is a buried word line formed in the substrate 100, for example, but the invention is not limited thereto. The word line WL may be extended along a direction D3. In addition, the word line WL may be electrically insulated from the substrate 100 by a dielectric layer (not shown). A material of the word line WL is tungsten, aluminum, copper, or a combination thereof, for example.

In the active regions AA, doped region 104 and doped region 106 are respectively formed in the substrate 100 at one side and another side of the word line WL. A method of forming the doped region 104 and the doped region 106 is ion implantation, for example.

A dielectric layer 108 is formed on the substrate 100. A material of the dielectric layer 108 is silicon oxide, for example. A method of forming the dielectric layer 108 is chemical vapor deposition, for example.

An opening 110 exposing the doped region 104 is formed in the dielectric layer 108. A method of forming the opening 110 is to perform a lithography process and an etching process on the dielectric layer 108, for example.

Referring to FIG. 1B, FIG. 2B, FIG. 3B, FIG. 4B and FIG. 5B, a bit line BL is formed on the substrate 100. For example, the bit line BL may be formed on the dielectric layer 108. The bit line BL may be extended along a direction D4, such that the word line WL and the bit line BL may be intersected with each other. In addition, the word line WL and the bit line BL may be electrically insulated from each other by a dielectric material (e.g., the dielectric layer 108). The bit line BL may be a single layer structure or a multilayer structure. In the present embodiment, it is illustrated that the bit line BL is the multilayer structure as an example. The bit line BL may include a conductor layer 112 and a conductor layer 114. The conductor layer 112 is a doped polycrystalline silicon, for example. The conductor layer 114 is a combination layer of tungsten/titanium nitride/titanium (W/TiN/Ti), for example.

The bit line BL is electrically connected to the doped region 104. For instance, a portion of the bit line BL may be filled in the opening 110 to be electrically connected to the doped region 104. That is, the bit line BL filled in the opening 110 may be used as a contact, but the invention is not limited thereto. In other embodiments, the contact used to be electrically connected to the bit line BL and the doped region 104 may be further formed. In addition, a hard mask layer 116 and a cap layer 118 may be formed on the bit line BL in sequence. A material of the hard mask layer 116 is silicon nitride, for example. A material of the cap layer 118 is silicon oxide, for example.

For instance, a method of forming the conductor layer 112, the conductor layer 114, the hard mask layer 116 and the cap layer 118 may include the following steps. A first conductor material layer (not shown), a second conductor material layer (not shown), a hard mask material layer (not shown) and a cap material layer (not shown) are formed on the dielectric layer 108 in sequence. Then, a lithography and etching process is performed on the cap material layer, the hard mask material layer, the second conductor material layer and the first conductor material layer.

In FIG. 1C to FIG. 1J, except the components that need to be illustrated, the components covered by other film layers are omitted.

Referring to FIG. 1C, FIG. 2C, FIG. 3C, FIG. 4C and FIG. 5C, an insulation material layer 120 and a shield conductor material layer 122 may be conformally formed on the bit line BL in sequence. A material of the insulation material layer 120 is silicon nitride, for example. A method of forming the insulation material layer 120 is chemical vapor deposition, for example. A material of the shield conductor material layer 122 is metal or doped polycrystalline silicon, for example. In the present embodiment, it is illustrated that the material of the shield conductor material layer 122 is titanium nitride as an example. A method of forming the shield conductor material layer 122 is chemical vapor deposition or physical vapor deposition, for example.

Referring to FIG. 1D, FIG. 2D, FIG. 3D, FIG. 4D and FIG. 5D, an etch back process is performed on the shield conductor material layer 122 and the insulation material layer 120 to form a shield conductor layer 122a and an insulation layer 120a respectively. In addition, in the aforementioned etch back process, a portion of or all of the cap layer 118 may be removed simultaneously. The etch back process is a dry etching process, for example.

An insulation material layer 124 covering the shield conductor layer 122a and the insulation layer 120a may be conformally formed on the bit line BL. A material of the insulation material layer 124 is silicon nitride, for example.

A method of forming the insulation material layer 124 is chemical vapor deposition, for example.

A dielectric layer 126 may be formed on the insulation material layer 124 at two sides of the bit line BL. A material of the dielectric layer 126 is silicon oxide, for example. In an embodiment, a method of forming the dielectric layer 126 may include the following steps. First, a dielectric material layer (not shown) covering the insulation material layer 124 may be formed by spin coating, and an annealing process may be performed on the dielectric material layer. Then, a chemical mechanical polishing process is performed on the dielectric material layer by using the insulation material layer 124 located above the bit line BL as a polishing stop layer.

A cap layer 128 covering the insulation material layer 124 and the dielectric layer 126 may be formed. A material of the cap layer 128 is silicon oxide, for example. A method of forming the cap layer 128 is chemical vapor deposition, for example.

Referring to FIG. 1E, FIG. 2E, FIG. 3E, FIG. 4E and FIG. 5E, a patterned photoresist layer 130 is formed on the cap layer 128. The patterned photoresist layer 130 may expose a portion of the cap layer 128 located above the doped region 106. The patterned photoresist layer 130 is formed by performing a lithography process, for example.

The cap layer 128, the dielectric layer 126, the insulation material layer 124 and the dielectric layer 108 exposed by the patterned photoresist layer 130 may be removed to form an opening 132 exposing the doped region 106. In addition, in a process of forming the opening 132, a portion of the doped region 106 may be removed.

Referring to FIG. 1F, FIG. 2F, FIG. 3F, FIG. 4F and FIG. 5F, the patterned photoresist layer 130 is removed. A conductor layer 134 is formed in the opening 132. A material of the conductor layer 134 is doped polycrystalline silicon or metal, for example. In the present embodiment, it is illustrated that the material of the conductor layer 134 is doped polycrystalline silicon as an example. A method of forming the conductor layer 134 is that a conductor material layer (not shown) filled in the opening 132 is formed, and then the conductor material layer outside the opening 132 is removed by a chemical mechanical polishing process, for example. In addition, in a process of removing a portion of the conductor material layer, a portion of the insulation material layer 124 may be removed simultaneously to form an insulation layer 124a, and the cap layer 128, a portion of the dielectric layer 126, the cap layer 118, a portion of the shield conductor layer 122a and a portion of the insulation layer 120a may be removed simultaneously. In addition, in a process of removing the portion of the conductor material layer, a portion of the hard mask layer 116 may be removed.

Thereby, a sidewall structure 136 is formed on a sidewall of the bit line BL. The sidewall structure 136 includes the insulation layer 120a, the insulation layer 124a and the shield conductor layer 122a. The insulation layer 120a is disposed on the sidewall of the bit line BL. The insulation layer 124a is disposed on the insulation layer 120a. The shield conductor layer 122a is disposed between the insulation layer 120a and the insulation layer 124a. In the present embodiment, the sidewall structure 136 is formed by the aforementioned method, but the invention is not limited thereto.

Referring to FIG. 1G, FIG. 2G, FIG. 3G, FIG. 4G and FIG. 5G, an etch back process may be performed on the conductor layer 134 to remove a portion of the conductor layer 134. The etch back process is a dry etching process, for example.

A spacer 138 may be formed on the conductor layer 134. A material of the spacer 138 is silicon nitride, for example. A method of forming the spacer 138 is that a spacer layer (not shown) is conformally formed on the conductor layer 134, and then an etch back process is performed on the spacer layer, for example. A method of forming the spacer layer is chemical vapor deposition, for example. The etch back process is a dry etching process, for example. The spacer 138 may be used as a mask to remove the conductor layer 134 not covered by the spacer 138, so as to form a contact 134a. A method of removing a portion of the conductor layer 134 is a dry etching method, for example.

Referring to FIG. 1H, FIG. 2H, FIG. 3H, FIG. 4H and FIG. 5H, a hard mask layer 140 and a patterned photoresist layer 142 may be formed on the sidewall structure 136, the hard mask layer 116 and the contact 134a in sequence. The patterned photoresist layer 142 is formed by performing a lithography process, for example. A material of the hard mask layer 140 is silicon nitride, for example. A method of forming the hard mask layer 140 is chemical vapor deposition, for example.

A portion of the hard mask layer 140 located at an end position of the bit line BL may be removed by using the patterned photoresist layer 142 as a mask, so as to form an opening 144 exposing the shield conductor layer 122a. In a process of removing the portion of the hard mask layer 140, a portion of the hard mask layer 116 and a portion of the sidewall structure 136 may be removed simultaneously. A method of removing the portion of the hard mask layer 140 is a dry etching method, for example.

Referring to FIG. 1I, FIG. 2I, FIG. 3I, FIG. 4I and FIG. 5I, the patterned photoresist layer 142 is removed. A patterned photoresist layer 146 may be formed on the sidewall structure 136, the hard mask layer 116 and the contact 134a, and the patterned photoresist layer 146 is filled in the opening 144. The patterned photoresist layer 146 is formed by performing a lithography process, for example.

A portion of the hard mask layer 140 located at another end position of the bit line BL may be removed by using the patterned photoresist layer 146 as a mask, so as to form an opening 148. A method of removing the portion of the hard mask layer 140 is a dry etching method, for example. The opening 148 and the opening 144 may be staggered arranged along the direction D3. A portion of the hard mask layer 116 may be removed by using the patterned photoresist layer 146 as a mask, so that the opening 148 exposes the bit line BL. A method of removing the portion of the hard mask layer 116 is a dry etching method, for example.

Referring to FIG. 1J, FIG. 2J, FIG. 3J, FIG. 4J and FIG. 5J, the patterned photoresist layer 146 is removed. An interconnection structure 150 electrically connected to the shield conductor layer 122a may be formed, and an interconnection structure 152 electrically connected to the bit line BL may be formed. The interconnection structure 150 and the bit line BL may be electrically insulated from each other by a dielectric material (e.g., the hard mask layer 116). A method of forming the interconnection structure 150 is to perform a metal interconnection process at an end position of the bit line BL, for example. A method of forming the interconnection structure 152 is to perform a metal interconnection process at another end position of the bit line BL, for example.

The interconnection structure 150 may include a contact 154 and a conductive wire 156. The contact 154 is disposed in the opening 144, and the conductive wire 156 is disposed on the contact 154. The interconnection structure 152 may include a contact 158 and a conductive wire 160. The contact 158 is disposed in the opening 148, and the conductive wire 160 is disposed on the contact 158. The contact 154 and the contact 158 may be staggered arranged along the direction D3. The contact 154 and the contact 158 may be located at one end and another end of the same bit line BL respectively. The conductive wire 156 and the conductive wire 160 may be extended along the direction D3 and the direction D4 respectively. The contact 154 and the contact 158 are combination layers of tungsten/titanium nitride (W/TiN), for example. The conductive wire 156 and the conductive wire 160 are combination layers of tungsten/tungsten nitride (W/WN), for example.

A dielectric layer 162 covering the interconnection structure 152 may be formed on the hard mask layer 140. A material of the dielectric layer 162 is silicon oxide, for example. A method of forming the dielectric layer 162 is chemical vapor deposition, for example.

A capacitor structure 164 electrically connected to the doped region 106 may be formed in the dielectric layer 162. The capacitor structure 164 may be electrically connected to the doped region 106 by the contact 134a. In a process of forming the capacitor structure 164, a portion of the hard mask layer 140 and the spacer 138 may be removed. In the present embodiment, the capacitor structure 164 is merely illustrative, but the invention is not limited thereto. A person skilled in the art may design and adjust the capacitor structure 164 according to the actual requirements. For instance, the capacitor structure 164 may be U-shaped, and the capacitor structure 164 may be electrically connected to the contact 134a by a landing pad (not shown).

Hereinafter, the dynamic random access memory 10 of the aforementioned embodiments are illustrated by FIG. 1B, FIG. 1J, FIG. 2J, FIG. 3J, FIG. 4J and FIG. 5J.

Referring to FIG. 1B, FIG. 1J, FIG. 2J, FIG. 3J, FIG. 4J and FIG. 5J, the dynamic random access memory 10 includes the substrate 100, the bit line BL, the sidewall structure 136 and the interconnection structure 150, and may further include at least one of the isolation structures (e.g., the isolation structures 102a and the isolation structure 102b), the word line WL, the doped region 104, the doped region 106, the capacitor structure 164 and the interconnection structure 152. The bit line BL is disposed on the substrate 100. The sidewall structure 136 is disposed on the sidewall of the bit line BL. The sidewall structure 136 includes the insulation layer 120a, the insulation layer 124a and the shield conductor layer 122a. The material of the shield conductor material layer 122a is metal or doped polycrystalline silicon, for example. The insulation layer 120a is disposed on the sidewall of the bit line BL. The insulation layer 124a is disposed on the insulation layer 120a. The shield conductor layer 122a is disposed between the insulation layer 120a and the insulation layer 124a. The interconnection structure 150 is electrically connected to the shield conductor layer 122a. The interconnection structure 150 may be electrically connected to the shield conductor layer 122a at an end position of the bit line BL. The interconnection structure 150 and the bit line BL may be electrically insulated from each other. The isolation structures 102a and the isolation structures 102b are disposed in the substrate 100 to define the active regions AA. The word line WL and the bit line BL may be intersected with and electrically insulated from each other. The doped region 104 and the doped region 106 are located in the substrate 100 at one side and another side of the word line WL respectively. The bit line BL is electrically connected to the doped region 104. The capacitor structure 164 may be electrically connected to the doped region 106 by the contact 134a.

In addition, the materials, the forming methods and the functions of each component in the dynamic random access memory 10 have been illustrated in the aforementioned embodiments, and will not be repeated herein.

Based on the aforementioned embodiments, it is known that the dynamic random access memory 10 can reduce the parasitic capacitance of the bit line BL by the shield conductor layer 122a. Thereby, the resistance capacitance delay (RC-delay) can be reduced, and the dynamic random access memory can have enough sensing margins. Accordingly, the dynamic random access memory 10 can have higher reliability and is conducive to apply to the low power dynamic random access memory structure. In addition, the method of manufacturing the dynamic random access memory 10 provided by the invention can be easily integrated with the existing processes.

Figure 6:
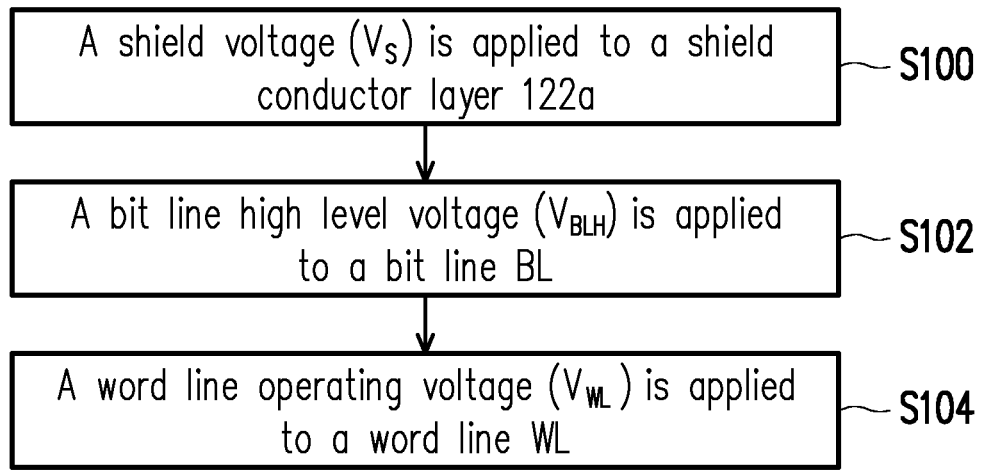
FIG. 6 is a write operation flowchart of a first logic level of a dynamic random access memory 10 according to an embodiment of the invention.

FIG. 6 is a write operation flowchart of a first logic level of the dynamic random access memory 10 according to an embodiment of the invention. In the present embodiment, it is illustrated that the first logic level is logic 1 as an example.

Referring to FIG. 6, a step S100 is performed, a shield voltage ($V_S$) is applied to the shield conductor layer 122a. A step S102 is performed, a bit line high level voltage ($V_{BLH}$) is applied to the bit line BL. The shield voltage ($V_S$) is larger than or equal to the bit line high level voltage ($V_{BLH}$). A step S104 is performed, a word line operating voltage ($V_{WL}$) is applied to the word line WL.

Figure 7:
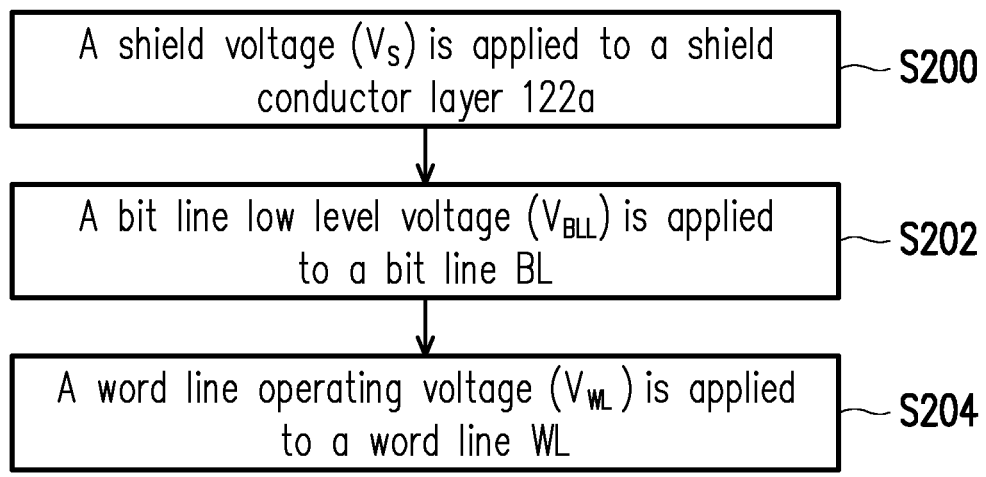
FIG. 7 is a write operation flowchart of a second logic level of the dynamic random access memory 10 according to an embodiment of the invention.

FIG. 7 is a write operation flowchart of a second logic level of the dynamic random access memory 10 according to an embodiment of the invention. In the present embodiment, it is illustrated that the second logic level is logic 0 as an example.

Referring to FIG. 7, a step S200 is performed, a shield voltage ($V_S$) is applied to the shield conductor layer 122a. A step S202 is performed, a bit line low level voltage ($V_{BLL}$) is applied to the bit line BL. The shield voltage ($V_S$) is smaller than or equal to the bit line low level voltage ($V_{BLL}$). A step S204 is performed, a word line operating voltage ($V_{WL}$) is applied to the word line WL.

FIG. 8 is a read operation flowchart of the dynamic random access memory 10 according to an embodiment of the invention. In the present embodiment, it is illustrated that the first logic level is logic 1 as an example, and the second logic level is logic 0 as an example.

Referring to FIG. 8, a step S300 is performed, before performing reading, an equalizing voltage ($V_{BLEQ}$) is applied to the bit line BL, and a shield voltage ($V_S$) is applied to the shield conductor layer 122a, wherein the equalizing voltage ($V_{BLEQ}$) and the shield voltage ($V_S$) are respectively smaller than a bit line high level voltage ($V_{BLH}$) and larger than a bit line low level voltage ($V_{BLL}$). The equalizing voltage ($V_{BLEQ}$) and the shield voltage ($V_S$) may be the same or different voltages. The bit line high level voltage ($V_{BLH}$) is a voltage applying to the bit line BL when storing the first logic level. The bit line low level voltage ($V_{BLL}$) is a voltage applying to the bit line BL when storing the second logic level. The equalizing voltage ($V_{BLEQ}$) is half of a sum of the bit line high level voltage ($V_{BLH}$) and the bit line low level voltage ($V_{BLL}$), for example. The shield voltage ($V_S$) is half of the sum of the bit line high level voltage ($V_{BLH}$) and the bit line low level voltage ($V_{BLL}$), for example. A step S302 is performed, the word line operating voltage ($V_{WL}$) is applied to the word line WL to perform reading the dynamic random access memory 10. In addition, after applying the equalizing voltage ($V_{BLEQ}$) to the bit line BL and after a period of waiting time, the word line operating voltage ($V_{WL}$) may be applied to the word line WL.

EXAMPLE

In Table 1 below, the voltages of write operation and read operation of the dynamic random access memory 10 according to an embodiment of the invention are illustrated, but the invention is not limited thereto.

TABLE 1

|  | Write logic 1 | Write logic 0 | Read |
| --- | --- | --- | --- |
| Word line voltage | 2.6 V | 2.6 V | 2.6 V |
| Bit line voltage | 1 V | 0 V | 0.5 V |
| Shield voltage | 1 V | 0 V | 0.5 V |

In summary, in the dynamic random access memory and the methods of manufacturing, writing and reading the same of the aforementioned embodiments, the parasitic capacitance of the bit line can be reduced by the shield conductor layer. Thereby, the resistance capacitance delay can be reduced, and the dynamic random access memory can have enough sensing margins. Accordingly, the dynamic random access memory can have higher reliability and is conducive to apply to the low power dynamic random access memory structure. In addition, the method of manufacturing the dynamic random access memory of the aforementioned embodiments can be easily integrated with the existing processes.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A dynamic random access memory, comprising:
a substrate;
a bit line, disposed on the substrate;
a sidewall structure, disposed on a sidewall of the bit line, and comprising:
 a first insulation layer, disposed on the sidewall of the bit line;
 a second insulation layer, disposed on the first insulation layer; and
 a shield conductor layer, disposed between the first insulation layer and the second insulation layer, wherein a top surface of the first insulation layer, a top surface of the second insulation layer, and a top surface of the shield conductor layer are coplanar; and
an interconnection structure, electrically connected to the shield conductor layer, wherein
the interconnection structure includes a contact located on the shield conductor layer,
first top surfaces of portions of the shield conductor layer directly below the contact are lower than second top surfaces of other portions of the shield conductor layer not directly below the contact, and
the portions of the shield conductor layer directly below the contact are located on two sides of the bit line.

2. The dynamic random access memory according to claim 1, wherein a material of the shield conductor layer comprises metal or doped polycrystalline silicon.

3. The dynamic random access memory according to claim 1, wherein the interconnection structure and the bit line are electrically insulated from each other.

4. The dynamic random access memory according to claim 1, wherein the interconnection structure is electrically connected to the shield conductor layer at an end position of the bit line.

5. The dynamic random access memory according to claim further comprising isolation structures, wherein the isolation structures are disposed in the substrate to define active regions.

6. The dynamic random access memory according to claim 1, further comprising a word line, wherein the word line and the bit line are intersected with and electrically insulated from each other.

7. The dynamic random access memory according to claim 6, further comprising a first doped region and a second doped region, wherein the first doped region and the second doped region are respectively located in the substrate at one side and another side of the word line, and the bit line is electrically connected to the first doped region.

8. The dynamic random access memory according to claim 7, further comprising a capacitor structure, wherein the capacitor structure is electrically connected to the second doped region.

* * * * *